(12) United States Patent
Bilan et al.

(10) Patent No.: US 10,354,938 B2
(45) Date of Patent: Jul. 16, 2019

(54) LIGHTING DEVICE USING SHORT THERMAL PATH COOLING TECHNOLOGY AND OTHER DEVICE COOLING BY PLACING SELECTED OPENINGS ON HEAT SINKS

(71) Applicant: Greentech LED, San Jose, CA (US)

(72) Inventors: Frank Albert Bilan, Victor, CA (US); Nhien Trang, San Jose, CA (US)

(73) Assignee: Greentech LED, San Jose, CA (US)

( * ) Notice: Subject to any disclaimer, the term of this patent is extended or adjusted under 35 U.S.C. 154(b) by 0 days.

(21) Appl. No.: 14/998,489

(22) Filed: Jan. 12, 2016

(65) Prior Publication Data

US 2017/0352605 A1    Dec. 7, 2017

(51) Int. Cl.

| | |
|---|---|
| *F21V 29/00* | (2015.01) |
| *H01L 23/367* | (2006.01) |
| *F21V 29/507* | (2015.01) |
| *F21V 29/76* | (2015.01) |
| *F21S 2/00* | (2016.01) |
| *H01L 21/48* | (2006.01) |
| *F21V 29/506* | (2015.01) |
| *F21K 9/23* | (2016.01) |
| *F21K 9/232* | (2016.01) |
| *F21S 8/06* | (2006.01) |
| *F21V 21/08* | (2006.01) |
| *F21W 131/40* | (2006.01) |
| *F21V 29/75* | (2015.01) |
| *F21V 29/83* | (2015.01) |

(Continued)

(52) U.S. Cl.
CPC ............ *H01L 23/3672* (2013.01); *F21K 9/23* (2016.08); *F21K 9/232* (2016.08); *F21S 2/005* (2013.01); *F21V 29/506* (2015.01); *F21V 29/507* (2015.01); *F21V 29/76* (2015.01); *H01L 21/4871* (2013.01); *F21S 8/06* (2013.01); *F21V 21/08* (2013.01); *F21V 29/75* (2015.01); *F21V 29/763* (2015.01); *F21V 29/83* (2015.01); *F21V 29/89* (2015.01); *F21W 2131/40* (2013.01); *F21Y 2105/16* (2016.08); *F21Y 2107/00* (2016.08); *F21Y 2115/10* (2016.08); *H01L 2224/48091* (2013.01); *H01L 2224/48247* (2013.01); *H01L 2224/8592* (2013.01)

(58) Field of Classification Search
CPC .................................. F21V 29/74; F21V 29/83
See application file for complete search history.

(56) References Cited

U.S. PATENT DOCUMENTS

| | | |
|---|---|---|
| 1,180,159 A | 4/1916 | Langmuir |
| 3,293,513 A | 12/1966 | Biard |

(Continued)

*Primary Examiner* — Andrew J Coughlin
(74) *Attorney, Agent, or Firm* — Ricky Lam

(57) ABSTRACT

A novel heat sinking technology, uniquely adaptive to LED lighting devices in a generally LED array format containing multiple openings on said heat sink's base portions and optionally fin portions providing "short path cooling" technology. The "short path cooling" technology is thoroughly taught with multiple examples. Also taught, are methods of heat sink area maintenance when said openings are placed on said heat sinks. Indeed, even surface area increases are shown to be possible when multiple openings are placed on said heat sinks. Lastly, other non-LED semiconductor cooling is discussed and illustrated in various figures using said "short path cooling" technology.

18 Claims, 25 Drawing Sheets

(51) Int. Cl.
*F21V 29/89* (2015.01)
*F21Y 105/16* (2016.01)
*F21Y 115/10* (2016.01)
*F21Y 107/00* (2016.01)

(56) References Cited

U.S. PATENT DOCUMENTS

| | | |
|---|---|---|
| 3,819,974 A | 6/1974 | Stevenson |
| 5,998,925 A | 12/1999 | Shimizu |
| 6,371,200 B1 * | 4/2002 | Eaton .................. C06B 25/02 |
| | | 165/104.33 |
| 6,827,130 B2 | 12/2004 | Larson |
| 8,882,297 B2 | 11/2014 | Flaherty |
| 8,926,139 B2 | 1/2015 | Reed |
| 8,944,669 B2 | 2/2015 | Chien |
| 8,952,613 B2 | 2/2015 | Anderson |
| 9,039,223 B2 | 5/2015 | Rudd |
| 9,068,738 B2 | 6/2015 | Auyeung |
| 9,091,424 B1 | 7/2015 | Mart |
| 9,131,556 B2 | 9/2015 | Tischler |
| 2011/0115358 A1 | 5/2011 | Kim |
| 2012/0075859 A1 | 3/2012 | Granado |
| 2015/0098222 A1 * | 4/2015 | Lin ..................... F21V 29/74 |
| | | 362/249.02 |
| 2015/0138770 A1 * | 5/2015 | Kwak .................... F21V 5/04 |
| | | 362/244 |

* cited by examiner

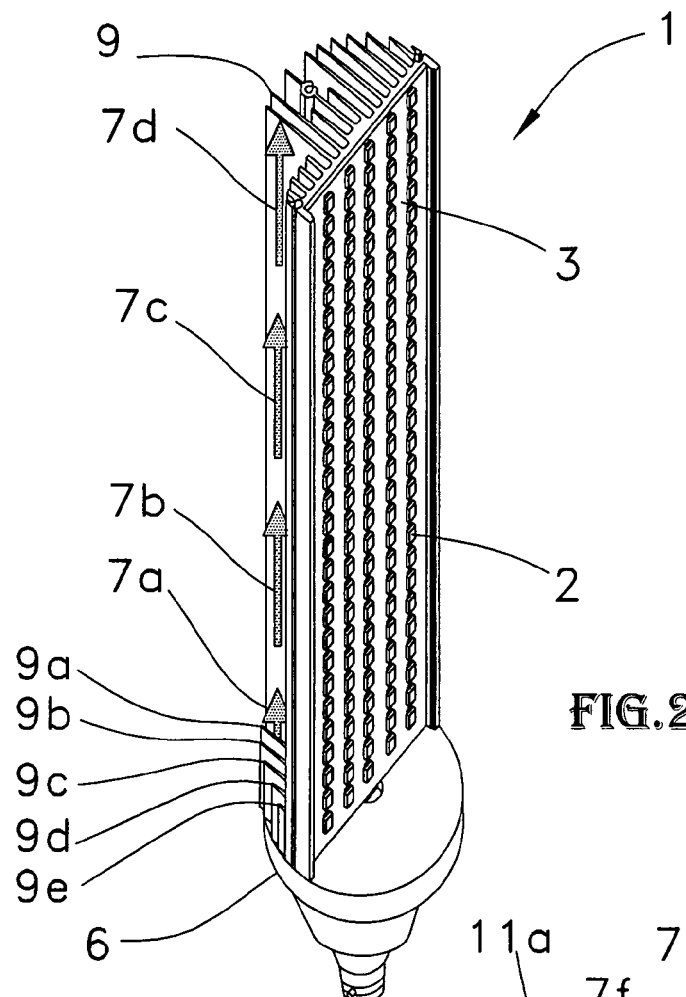
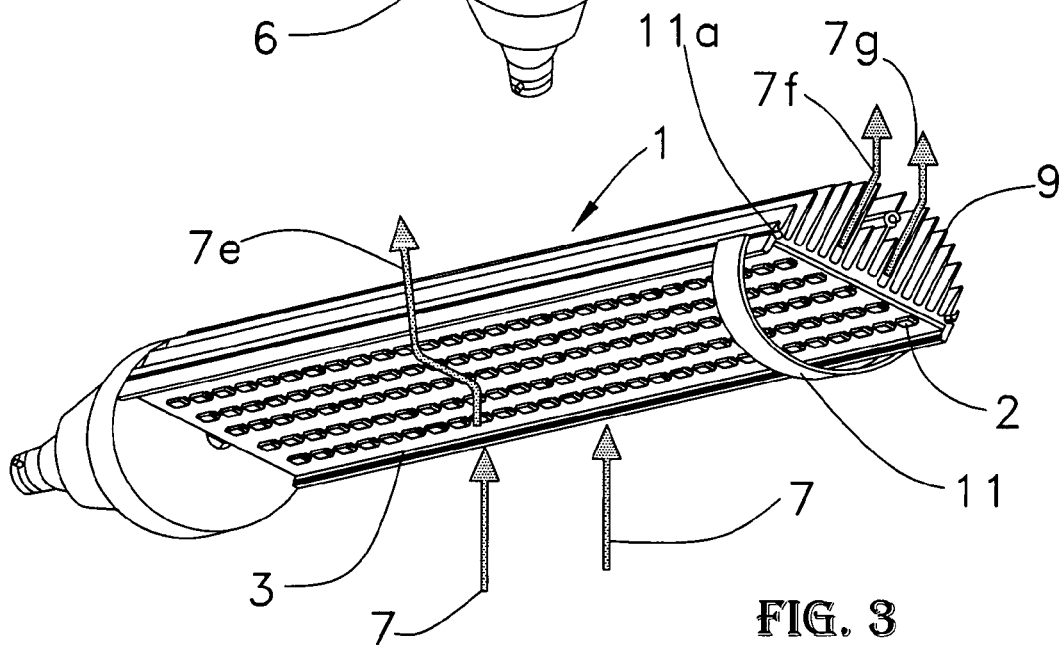

VIEW M1

VIEW C-C

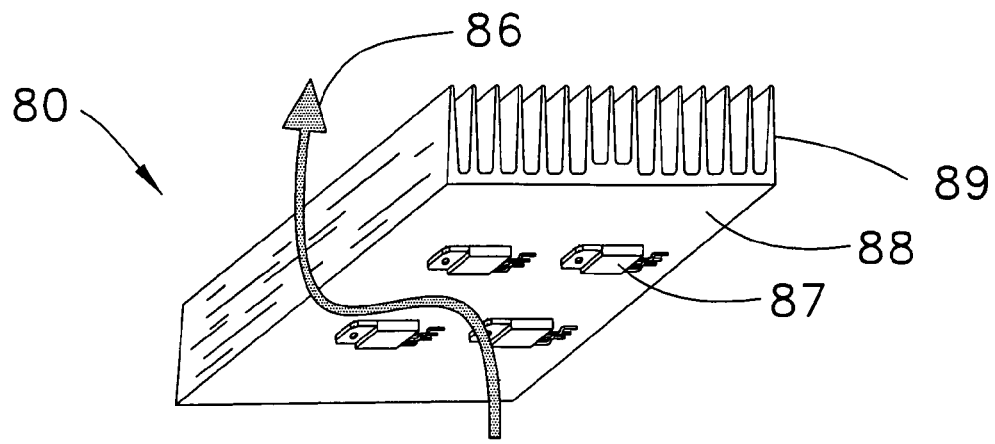
FIG. 19
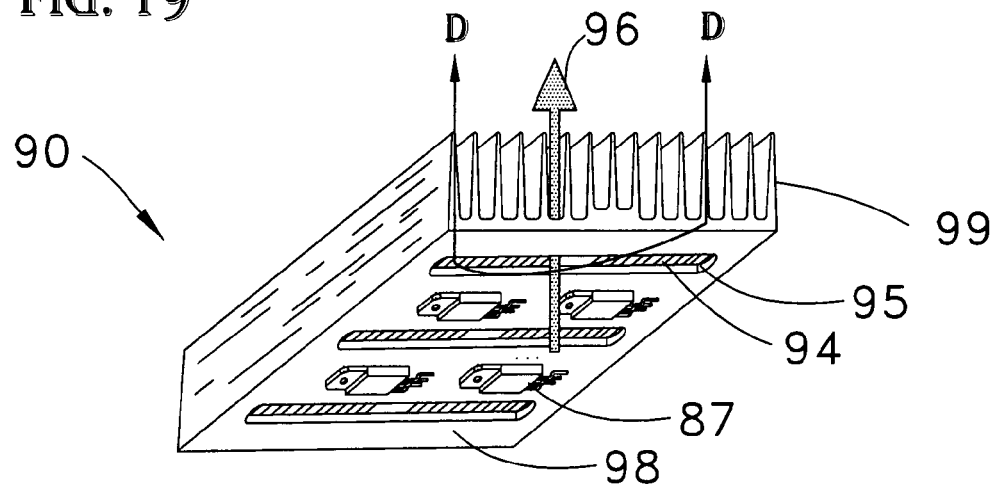
FIG. 20
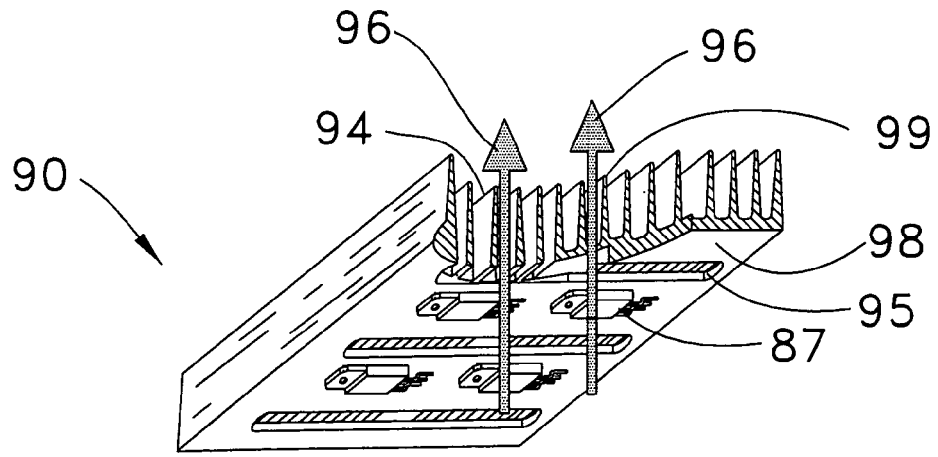
FIG. 21  VIEW D-D

VIEW E-E

VIEW F-F

VIEW G-G

VIEW J-J

LIGHTING DEVICE USING SHORT THERMAL PATH COOLING TECHNOLOGY AND OTHER DEVICE COOLING BY PLACING SELECTED OPENINGS ON HEAT SINKS

BACKGROUND

Field of the Invention

In a class of embodiments, the present invention is a heat sinking technology applied, but not limited to, electrical lighting devices, namely devices using Light Emitting Diodes (LEDs) in an assembly with a heat sink technology that is more efficient than current designs and thus helps keep the LEDs cooler.

In this present $21^{st}$ century, with the advent of the high brightness Light Emitting Diode (LED), these said LEDs have begun to replace the electrically less efficient incandescent light bulbs and fluorescent tubes. Presently, there is no such device as a "white light" emitting semiconductor diode. Light emitting diode chips emit an almost monochromatic light of predominantly one wavelength or a few closely spaced wavelengths. White LEDs use blue or ultra violet light emitting silicon chips. This blue or ultra violet light excites a phosphor which in turn emits white light by a process known as the Stokes shift emission. Using an appropriate mix of phosphor types, a white light can be produced. For example a white LED can be made that is "a warm light" or "a cool light". This is the same as in fluorescent tube technology—obviously so—they both use phosphors for white light emission.

Before the invention of the light emitting diode (emitting infra-red light) manifested publicly in the form of U.S. Pat. No. 3,293,513, and a blue LED, U.S. Pat. No. 3,819,974, and eventually a white LED, U.S. Pat. No. 5,998,925, electrical lighting was based upon high temperature phenomena. Take for example, a white-hot tungsten filament in the familiar domestic incandescent light bulb. Later the fluorescent tube was developed which used high temperature ionized gas technology to emit ultra violet light, which in turn exited a phosphor inside the said tube, producing white light. This is well and good. However there is a major problem.

Past light emitting devices (excepting chemical or bio-luminescent) from the candle to the incandescent filament bulb to the electric gaseous discharge tube etc. required a high temperature for the light production.

This means that the said light producing devices of the past could not tolerate a low temperature environment. Hence they were enclosed in an insulated enclosure, generally made of a borosilicate glass or quartz material; the candle or oil lamp being an obvious exception since they use a fuel other than electricity and consume oxygen. Indeed the famous Nobel Prize Laureate Irving Langmuir improved upon the Edison incandescent light bulb by placing a gas into the formally vacuum environment of Edison's incandescent light bulb (U.S. Pat. No. 1,180,159). The inert gas in Langmuir's light bulb produced an insulative effect, (see page 2 lines 30-41 and 71-74 of said patent) by reducing the heat dissipation of the said filament, thus requiring less electrical energy to be supplied to the said filament.

What does this mean and of what relevancy is this to the present teaching? Very much indeed. Virtually all light fixtures in the world from the elegant chandelier in the kings palace to the naked light bulb deep in the underground mine do not overly concern themselves with cooling the light fixture. In very high power light fixtures like Hollywood film studios for example, they indeed do cool these lights; but only to prevent these powerful light bulbs from self-destruction due to their very high power per unit volume design.

Now in the United States and in some other countries, two forces have come into play:

a. The power of technology, with the invention of the LED and b. The power of government, with legislated mandates.

The former power has given us high brightness LEDs and the latter power is banning mercury, a necessary ingredient in efficient fluorescent tubes. Also electrical energy-saving mandates are being imposed. There are literally billions of conventional light fixtures in the United States, let alone the rest of the world. And almost without exception, they all dissipate heat poorly. The LED is not a high temperature light emitting device. It requires cooling.

Indeed if one inspects the typical LED device datasheet, he or she will discover that in some cases the light output and electrical specification is measured at 25° C., i.e. room temperature. (Good luck engineers, at achieving this capability while lighting up these LEDs). Basic physics teaches us that for heat transfer to occur we must have a delta T ($\Delta T$)—a temperature difference for heat to flow from hotter to cooler. Therefore the typical LED, when operating, will always be about 20 to 30° C. hotter than the heat sink. And then, the heat sink must also be hotter than the ambient air.

In the business, cool LEDs live a long time, while hot LEDs die young.

Also, the greater the $\Delta T$, the smaller is the area required for a heatsink to dissipate a given BTU (British thermal unit) of heat. Now therefore, common incandescent light bulbs operate at $\approx 2500°$ C., while LEDs should operate at a silicon junction temperature of <100° C. for long life. This explains why LED chips require huge heat sinks relative to their size.

Due to the afore mentioned government mandates, an ongoing industry has sprung up solely for the purpose of retro-fitting the incandescent and gaseous tube fixtures with LED based light bulbs, tubes, arrays etc. A truly proverbial square peg forced into a round hole, since all these conventional fixtures provide a hostile environment to the cooling arts. This is not the case with new building designs. The architect has a plethora of wonderful LED light fixtures, properly designed by competent engineering companies. But for each new building there are perhaps thousands of older buildings let alone street lights etc. that need to be accommodated with these new LED devices.

Definition of Terms

For the purposes of the present disclosure, the Abstract portion of this document is to enable the public, and especially the scientists, engineers, and practitioners in the art who are not familiar with patent or legal terms or phraseology, to determine quickly from a cursory inspection, the nature and essence of the technical disclosure of the application. The Abstract is neither intended to define the inventive concept(s) of the application, which is measured by the claims, nor is it intended to be limiting as to the scope of the inventive concept(s) in any way.

For the purposes of the present disclosure, the phrase "A and/or B" means (A), (B), or (A and B).

For the purposes of the present disclosure, the phrase "A, B, and/or C" means (A), (B), (C), (A and B), (A and C), (B and C), or (A, B and C).

The descriptions may use perspective-based descriptions such as top/bottom, in/out, over/under and the like. Such descriptions are merely used to facilitate the discussion and are not intended to restrict the application of embodiments described herein to a particular orientation.

Thru out this teaching, the term "distal" is in reference with the object; distal being further away, while proximal would be closer to the object.

The description may use the phrases "in an embodiment," or "in embodiments," which may each refer to one or more of the same or different embodiments. Furthermore, the terms "comprising", "including", "having", and the like as used with respect to embodiments of the present disclosure, are synonymous.

The term "coupled with", along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Unless otherwise specified, throughout this disclosure, including in the claims, the expressions "LED" denotes a light emitting diode or other solid state device generally emitting a white light. It can also refer to a red, green, blue, orange or yellow light emitting diode. It can also refer to an RGB multi-chip diode assembly (RGB denotes a red/green/blue diode assembly in one package or three individual said diodes close together, capable of emitting each of its colors separately or all three together, simulating white light at a distance).

Unless otherwise specified, throughout this disclosure, including in the claims, the expressions "OLED" (Organic Light Emitting Diode) denotes a light emitting device creating light with organic based technology rather than silicon semiconductor based technology. It is presently used in some cell phones. It can also refer to a red, green, blue or yellow OLED. It can also refer to an RGB OLED device. (RGB denotes a red/green/blue OLED device).

The term "tube" refers to a fluorescent tube or other gaseous light source; for example a low pressure sodium lamp etc.

The term "plug" or "base plug" generally refers to a lighting devices bottom end piece having an electrical connector for plugging onto an electrical socket. A similar example would be the common light bulb with the base having a plug that engages to an electrical light socket.

The term "top" or "bottom" of a LED lighting device generally refers to the opposite end of the said lighting device's base plug. A similar example would be the common light bulb with the base being the bottom and the bulb being the top.

In this teaching, the expression "hoop device" is generally a support device for long LED lighting devices such as depicted in FIGS. 1-13. These devices are generally necessary when used in horizontal or angular light fixtures as a second support. These said hoop devices can be a half hoop device with two end-clip hooks or can also be full hoops with the clip hooks placed internally at 180° apart.

In this teaching, the expression "PCB" denotes a printed circuit board generally bonded to a thin metal cladding. The printed circuit board itself is extremely thin, in the order of 0.005 inches or so and is a very poor conductor of heat, about 0.25 W/mK, (where W is watts of power, m is in square meters thru which the heat is conducting and K is the temperature difference in degrees Kelvin) hence the extreme thinness used. The said thin PCB is chemically bonded to an aluminum substrate, a good conductor with a thermal conductivity of about 140-201 W/mK (depending on alloy) or in high power applications, copper, whose thermal conductivity is about 430 W/mK whose thickness is substantially greater. The said metal substrate thickness can be as thin as 0.02 inches to 0.25 inches or more.

Furthermore, the expression "PCB" can also denote a printed circuit on a nonmetallic substrate such as ceramic which is available in a number of varieties and thermal conductivities. For example the military and aerospace industry has used beryllium oxide (BeO) ceramic material for years. It has a high thermal conductivity, but is poisonous and very expensive.

Unless otherwise specified, "PCB of hybrid composition" is a PCB consisting of copper traces electrically insulated from a base material such as copper, aluminum, various ceramic powders or other highly thermally conductive materials. It is termed a hybrid printed circuit board because it is constructed of a mixture of different materials.

Unless otherwise specified, the terms "heat sink" or "heat sinks" throughout this teaching refer to a relatively large surface area device that transfers conducted heat from a relatively very small area LED or other semiconductor heat source attached to the said heat sink device which then dissipates the said heat to the ambient air thru the process of convection and radiation. These said heat sinks are generally made of a selected metal or metal alloy, but are not limited to these. Plastic/composite and selected allotropes of carbon known as graphene having an anisotropic thermal characteristic are also possible. To summarize, the said heat sinks accept conducted heat and then dissipate the said heat to the ambient atmosphere by convection and radiation.

The term "hole" or "holes" or "opening" as used on a heat sink or PC is defined as a generally but not limited to an essentially circular opening thru a material usually but not limited to metal. It may be drilled, milled, punched, pierced, cut with a laser etched or molded etc. It does not necessarily need to be perfectly round, but can be square, hexagonal or other shape/s. For example, laser cutting or chemical etching may produce various shape/s of polygon, star, cross etc.

The term "slot" or "slots" as used on a heat sink is defined as a generally but not limited to a perimetrical, essentially oblong/rectangular opening thru a material usually but not limited to metal. It may be punched, milled, cut with a laser etched or molded etc. It does not necessarily need to be a perfect rectangle but can have round ends such as an end mill would make, or can be square ended such as a metal punch would produce. For example, laser cutting or chemical etching can produce a variety of shapes of slots such as straight, curved, arced etc. Additionally, the said slots do not need to be full slots in the sense that the said slots consists of two long sided and correspondingly two short sides; the said slots can have two long sides and only one short side. For example, a slot can be cut into a heatsink fin and continue to be cut until it cuts thru the fins top (top being the distal point from the base of the heat sink where the fin is attached) thus producing an open ended slot.

Unless otherwise directly or indirectly or by context defined, the expression "L bend" refers to a generally 90° bend in a thin fin used on heat sinks. (The term 90° means exactly that—within the accuracy limits of standard industry practice. The intent of this teaching and in the claims is that 90° is in fact a variable, dependent on the accuracy of the industry practice.) The said "L bend" can also be greater or less than 90°, depending on design requirements. The "L" bent section width and angle is selected by the designer.

Unless otherwise directly or indirectly or by context defined, the expression "first side" and "second side" of a heat sink's base portion or fin portion refers to a heatsinks base or fin large area sections and not to their edge portions.

Unless otherwise directly or indirectly or by context defined, the expression "cooling medium" is generally ambient air, but can be other gas/gasses or liquids. The said cooling medium can be forced flow or non-forced flow.

The term "maintains surface area" or "surface area maintaining" as used in this teaching and/or the claims means the removal of heat sink material to produce selected holes, slots or other shape openings such that the total heat sink area exposed to air or other cooling gasses or liquids is not substantially reduced. For example, the reduction in said heat sink surface area can be allowed to be as high as 30% to 50% or more if it produces a more efficient heat sink due to better air or other gas or liquid flow thru said heat sink. But generally it is an ideal goal to either maintain the same said surface area of said heat sink or to even increase the said area by a technique taught in this disclosure.

A deliberate reduction in said surface area may be desired to allow a cooling medium to flow thru more freely to cool other items as desired. For example, an electrical apparatus in a cabinet may have a plurality of individual heat sinks which need cooling air coming from a first side of said cabinet and this said cooling air has to be directed to various heat sinks in said cabinet and then exit out thru a second side of said cabinet. Therefore, heatsinks near the fresh air entry may need to be of lesser area per unit watt/BTU dissipation, while heatsinks far from the said fresh air entry may need to be of larger area per unit watt/BTU dissipation.

The term "matching" or "PCB matching" or "heat sink matching" in reference to holes or slots being placed on a selected area of a PCB or a heat sink generally denotes a matched set of holes or slots on the said pair of items (namely a PCB mated to a heat sink). The said matching does not necessarily have to be perfect. For example, a hole or slot on a heat sink can be larger or smaller in dimension than on its mating PCB and vice versa.

Unless otherwise specified, the term "air", "air flow", "air cooling" etc. generally refers to the ambient atmospheric air but is not limited to the said ambient atmospheric air. In special cases such as for example, the section of this teaching, "OTHER APPLICATIONS OF THE PRESENT INVENTION", it can refer to other gasses or liquids.

The vernacular term "breathe" as used in this disclosure refers to a heat sink or an entire LED lighting device being designed in such a manner that allows free air to circulate in and around the said heat sink/LED lighting device as freely as possible, providing efficient cooling.

The terms "edge effect", "boundary layer", "Bernoulli principle", "Langmuir's laminar flow theory" and "crowding effect" etc. are thermodynamic terms whose definitions are available in a variety of technical text books or other publications on the said subject. Therefore these terms will not necessarily be defined in this disclosure The expression "mounted" generally applies to a fixture affixed in its place using industry professional procedures such as bolting, screwing, nailing, gluing, clinching, interference press fitting, clamping etc.

The term "ballast" can refer to an inductive electrical current limiting device or an electronic device that may perform both current limiting and power supply functions. In special cases, other electronic control functions may be incorporated. For example, wired or wireless control for various functions such as for example, Pulse Width Modulation, Pulse Frequency Modulation, Spread Spectrum Pulse Modulation of LEDs etc. Other functions can be included, such as ambient light sensors, occupancy sensors, timers, wireless transmission and reception for control and status reporting etc.

Thru out this teaching, electrical wire connections will not be shown. They are well known to the technical art.

Unless otherwise specified, thru out this teaching, light fixture bezels, dust covers, decorative trim etc. will not be shown. They are also well known in the art.

BRIEF DESCRIPTION OF THE PRIOR ART

Several devices related to the present invention have been identified during this inventor's Due Diligence Search. They are as follows:

Patent Application US 2011/0115358 by Kim discloses a LED light bulb using side emitting LED devices.

Kim discusses a plurality of heatsinks each for a group of LEDs. The present invention discuses a plurality of heatsinks, but with specially designed holes or slots for better air flow.

Kim also discusses a plurality of light diffusers. The present invention discuses only one light diffuser/light cover/dust cover which is made with openings to allow air flow.

KIM discusses a central hollow pillar for mounting LED module units in a stacked format. The present invention discuses a central pillar or hub, but teaches a radial placement of a plurality of LED modules in a radial fashion.

Patent Application US 2012/0075859 by Granado et al. discloses a LED lighting device using high power LED assemblies.

Granado uses a large finned heat sink for cooling the LEDs. Granado teaches a large base portion with a power connector and complex power conversion circuitry in the said base portion. The present invention discuses a single heat sink or a plurality of heatsinks, but with specially designed holes or slots for better air flow. Granado does not teach this. The present invention also teaches a base portion with a power connector but not with the complexity of Granado. Indeed, the present invention initially offers the first embodiment using a base portion with no built-in power circuits and low power LEDs and other embodiments with simple electronic ballasts.

U.S. Pat. No. 8,952,613 to Anderson et al. teaches cooling air entering thru a transparent cover portion to cool the covered heatsink area of an incandescent light bulb LED replacement device. This is an excellent start for more cooling efficiency. The present invention discuses a heat sink and a plurality of heatsinks for a substantially larger fixture containing fifty (50) to over two hundred (200) individual LEDs, but with specially designed holes or slots for better air flow. Anderson does not teach this. The present invention also discusses an optional light diffuser/light cover/dust cover which is made with dozens of relatively small openings closely spaced to allow a relatively large air flow to a much larger light fixture than the light bulb type Anderson speaks of.

U.S. Pat. No. 8,944,669 to Chien discloses a LED lighting device using removable LED assemblies in a track format, which said tracks can be arranged in a plethora of differing configurations. A wonderful patent, clearly, thoroughly thought out. However, Chien does not teach short path heatsink cooling as does the present invention.

U.S. Pat. No. 9,068,738 to Auyeung discloses a LED lighting device with a heatsink having holes in the fins. This is a well-engineered design with excellent optics for even light distribution.

The present invention discuses a plurality of heatsinks, but with specially designed holes or slots for better air flow. Additionally, the present invention teaches that holes or other openings in heat sink fins should be of a size to maintain exposed said fin surface area. Auyeung does not; neither does he teach openings in the base plate portion to allow short path air cooling to occur as does the present invention.

U.S. Pat. No. 6,827,130 to Larson discloses a heat sink assembly with holes in a closed "plenum" type of arrangement with forced air cooling.

The present invention discuses a plurality of heatsinks, but with specially designed holes or slots for better air flow. Additionally, the present invention teaches that holes or other openings in heat sink fins should be of a size to maintain exposed said fin surface area. Larson does not teach this; neither does he emphasize non-forced ambient air cooling for his heat sink device.

U.S. Pat. No. 9,091,424 to Mart et al. discloses a "LED Light Bulb"; a misnomer of sorts, but nevertheless a LED lighting device that can be used as a track light etc. Mart discusses holes (he calls them vents) in the front face of the lighting device that is an integral housing and heatsink assembly. The said holes extend thru the body of the said LED lighting device from front to back. A fan is placed in the rear and air is forced thru the said LED lighting device body to cool the said body. Mart teaches that for lower power LED lighting devices a fan is not necessary.

The present invention discuses a plurality of heatsinks, but with specially designed holes or slots for better air flow preferably without using a fan in lighting applications due to fan noise and fan reliability. Additionally, the present invention teaches that holes or other openings in heat sink fins should be of a size to maintain exposed said fin surface area. Mart does not teach this; neither does he emphasize hole sizing or holes/slots on heatsink fins.

Mart does state in column 4, lines 32-35: " . . . In at least some embodiments, the number of vents is dependent on the amount of air flow needed thru the interior of LED bulb 100 to maintain the temperature below the predetermined threshold". Clearly, Mart understands basic thermal engineering principles. But he does not teach the maintaining of heat sink fin surface area. Nor does he teach the cutting of openings to expose selected heat sink fin base attachment areas as taught by this invention.

U.S. Pat. No. 9,039,223 to Rudd et al. discloses a LED Lighting Fixture for high power applications such as streetlights. Rudd discloses individual LED arrays wherein each said LED array section is mounted on a separate heat sink and then these LED array/heat sink assemblies are joined side by side into a plurality of assemblies to form the desired lighting fixture.

The present invention mounts a plurality of LEDs on a heatsink fin, and then attaches them not side by side, but one heat sink fin in front of another to complete a desired lighting fixture. Furthermore, slots, holes or other shaped openings are provided in the present invention to increase the heat sinking efficiency using short path airflow techniques Rudd does not teach this. When using a conventional extruded aluminum heat sink, this invention also discloses various slots or other shaped openings to allow short path air flow which results in the said heat sink becoming a more efficient heat dissipating unit. Rudd does not teach this.

BRIEF DESCRIPTION OF THE DRAWINGS

In a class of embodiments, the present invention consists of a Base Plugged Light Emitting Diode lighting device (one class of embodiments) coupled to an efficient heat sink (another class of embodiments). Also the same efficient heat sink technology is disclosed for other cooling functions. (yet another class of embodiments). The inventor understands that this disclosure could be a teaching solely for a more efficient heat sink, However it will become obvious that this new heat sink technology is uniquely applicable to the cooling of LED devices due to the heat sink using carefully designed openings for efficient cooling and in selected embodiments using transverse slot openings on extruded heat sinks or holes or other shaped openings etc. for non-extruded heat sinks for efficient air flow. The inventor claims by reference other heat sink applications such as, for example efficient cooling of non LED semiconductor devices or liquid pipe cooling in high power electronic devices etc. The inventor further understands that most configurations of heat sinks do function if huge quantities of forced air flow are impinged upon the said heat sinks. However, in the practical world of domestic, office, laboratory, studio, etc. lighting, forced air cooling is seldom used. This invention is ideal for generally ambient still air cooling.

The object and features of the present invention, as well as various other features and advantages of the present invention will become apparent when examining the descriptions of various selected embodiments taken in conjunction with the accompanying drawings and term definitions in this document in which:

FIG. 2 shows an assembled perspective view of a LED lighting device in a vertical position.

FIG. 3 shows an assembled perspective view of a LED lighting device in a horizontal position.

FIG. 19 illustrates a perspective view of a first horizontally positioned very common heat sink.

FIG. 20 illustrates a perspective view of a Eleventh Embodiment second horizontally positioned heat sink of the present invention.

FIG. 21 illustrates a sectional perspective view of a second horizontally positioned heat sink of the present invention.

DETAILED DESCRIPTION OF THE PREFERRED EMBODIMENTS

The following embodiments are presented for a thorough teaching of the present invention. To aid the reader of this teaching, the various embodiments with their accompanying figures will be explored seriatim in a stand-alone manner whenever possible.

First Embodiment of the Present Invention

Figure 1:
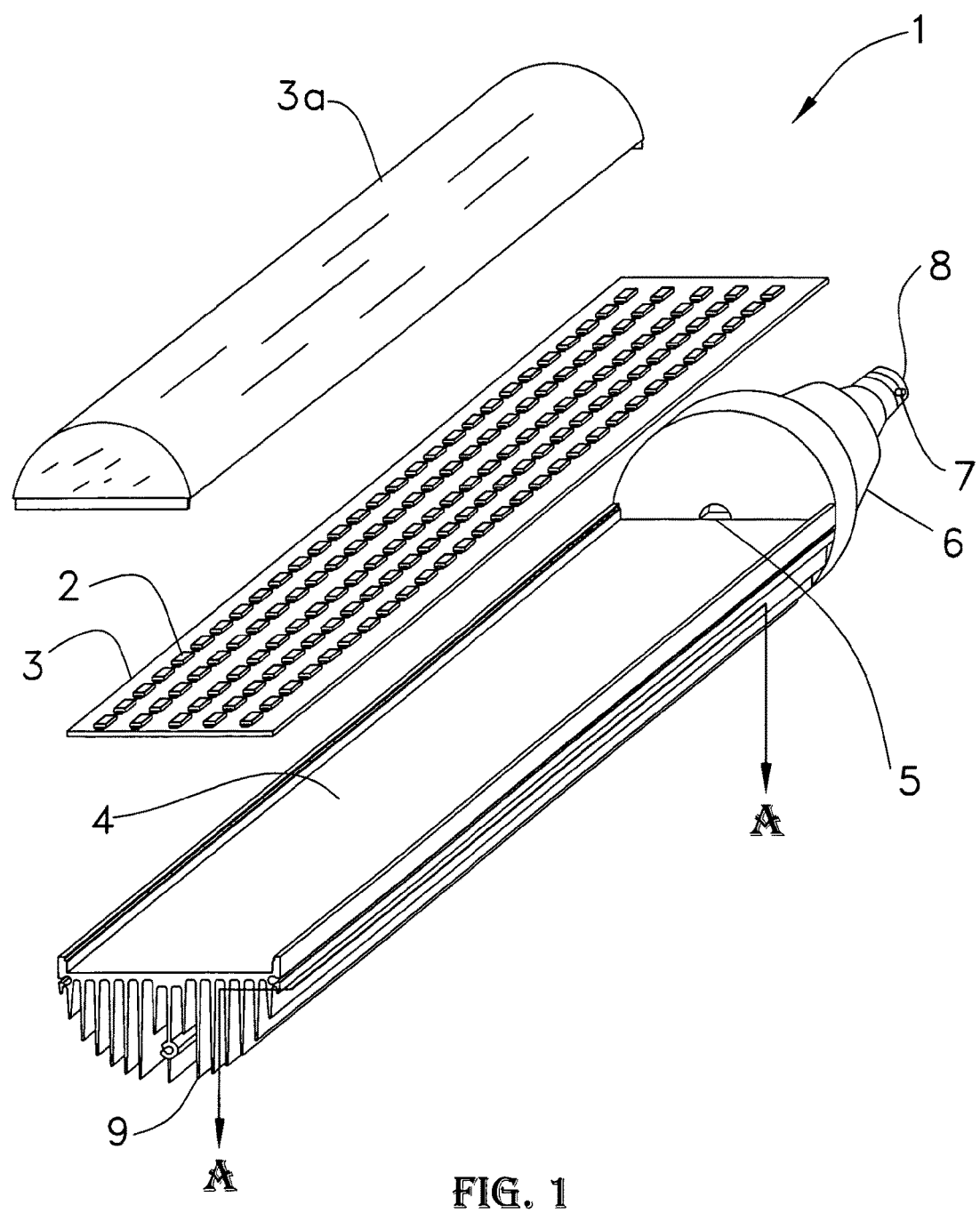
FIG. 1 shows a partially exploded perspective view of a First Embodiment LED lighting device.

FIG. 1 shows a partially exploded perspective view of a LED lighting device 1 consisting of a metal clad printed circuit board 3 with an array of LEDs 2 mounted thereon. Shown below the said items is an extruded aluminum heat sink 9 with a generally flat surface 4 which is mechanically attached to a housing 6 which is attached to a bayonet base 8 containing two locating lugs 7. The bayonet base illustrated is a type B22d. However, this teaching is not limited to the said bayonet base. A transparent cover 3a is also provided which can come as a transparent/translucent plastic cover or it can have multiple perforations if air flow is needed as will be described in subsequent descriptions of various embodiments of the present invention. The housing 6 contains no built in ballast. Note section A-A in said FIG. 1 for FIG. 2 description.

FIG. 2 shows an assembled perspective view of a LED lighting device in a vertical position. We will now discuss the thermal aspects of the heat sink 9. When the heat sink 9 begins to absorb heat by conduction from the LEDs 2 via thermally conductive PCB 3, thermally mounted to heat sink 9, air currents will begin to flow. The hottest parts of the heat sink will be the internal spaces of fins 9b, 9c, 9d and 9e located in the crowded areas of the heat sink 9 fins. For clarity heat sink 9 fins 9b, 9c, 9d and 9e have been cut away at section A-A in FIG. 1 to show internal air currents 7a thru 7d. Now therefore, air currents will begin to form, illustrated by arrows 7a, thru 7d. The reader is encouraged to imagine these air currents as occurring not just partially distal to the heat sink 9 fin bottoms as shown by arrows 7a thru 7d, but also very much proximal to the deep inner fin parts of the heat sink 9 where little air current motion is going on partly due to a crowding effect by the closely spaced heat sink 9 fins. The reason for this is that there is no high velocity artificially forced air movement such as provided by a fan, for example. This is a fundamentally inefficient heat sink. Why?

High school physics teaches us that hot air rises up in still air. So now let us imagine that air depicted by arrow 7a is moving up between the heat sink 9 fins. It will absorb heat from said fins. By the time it has reached the vertical level of arrow 7b, it will have heated somewhat so that that the ΔT between the heat sink 9 fins is significantly reduced.

Recollect that heat transfer is a function of temperature difference, ΔT between the heat sink 9 and the gently rising air current 7a thru 7b. Now therefore we have a conundrum; by the time we have the same said air current reaching arrow 7c, the said air current is even hotter, reducing the ΔT to almost zero.

Therefore the said air current goes for a tree ride to a level depicted by arrow 7d, doing no heat absorbing work and out into the environment. Additionally, housing 6 hinders the entrance of air currents at the lowest level of the heat sink 9 since it is butted hard up against the heat sink 9, further decreasing heat sink 9 efficiency. This has been a simplistic explanation since there are complex air currents involved in most heat sink operations, too complex to write here. Suffice to say, the above teaching covers the major effects.

FIG. 3 shows an assembled perspective view of a LED lighting device in a horizontal position. Here we have a situation much more complex to analyze. Once again, during operation of LED lighting device 1, heating will occur. Air proximal to the LEDs 2 and PCB 3 will absorb heat and will begin to rise, hitting a brick wall so to speak. Said air currents 7 will be forced to bend around the lighting device 1 as depicted by arrow 7e and up into the environment.

Air currents in and around the heat sink 9 fins are very complex to analyze. Air currents at 7f and 7g depict crudely these air currents rising out of the interstitial spaces of the heat sink 9 fins. Laboratory data has shown that the heat sink 9 does indeed do a reasonable job of heat dissipation, almost as good as in the vertical position. One can speculate that various turbulent short path micro-currents are here occurring in and out of the horizontally placed heat sink 9 fins. Also air currents do not travel along the longitudinal path depicted in FIG. 2, but rise up perpendicularly from the heat sink fins.

Nevertheless, the present invention is a useful device because it is inexpensive to manufacture and there is minimal pre or post machining necessary on extruded aluminum heat sink 9. A half hoop device with two end clip hooks made of metal or plastic is also shown fitted to grooves 11a to act as a support when placed in a fixture without a plastic cover as shown in FIG. 1. The said half hoop device with two end-clip hooks can also be a full hoop with the clip hooks placed internally at 180° apart. These half hoop or full hoop devices become very necessary when this first embodiment light fixture is long; for example they are presently made in 42 inch (1.07 meters) lengths. Furthermore, these said hoop devices could be used in other similar embodiments. For clarity of other descriptions, they will not be illustrated in following embodiments, but are incorporated herein by reference.

Figure 3A:
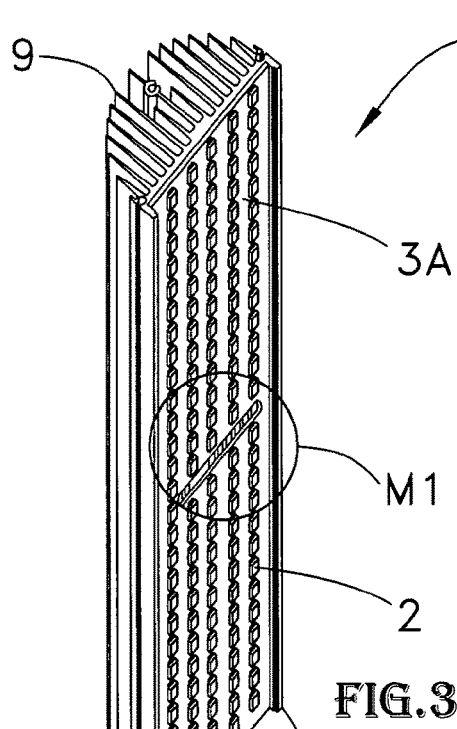
FIG. 3A shows an assembled perspective view of a LED lighting device in a vertical position.

FIG. 3A shows an assembled perspective view of a First Embodiment LED lighting device in a vertical position similar to device illustrated in FIGS. 1 thru 3. Note that a slot 9b has been added in the area labeled M1.

Figure 3B:
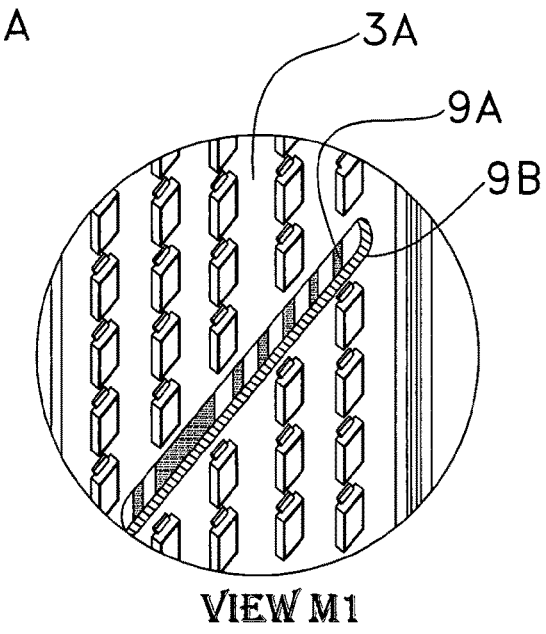
FIG. 3B shows a magnified view of a portion of FIG. 3A

FIG. 3B shows a magnified view of area M1 of FIG. 3A. An exemplary slot 9b has been added which cuts thru the PCB 3a and heat sink base 4a (shown in FIG. 3a), exposing the attachment bases of heat sink fins 9a. Air can now enter thru the slot 9b and move over the heat sink bases 9a and on out, cooling the said heat sink fins 9, (shown in FIG. 3a) beginning at the hottest part of the said heat sink which is at the junction of the heat sink fin 9a and the base 4a (shown in FIG. 3a). This is illustrated clearly in FIG. 3C.

Figure 3C:
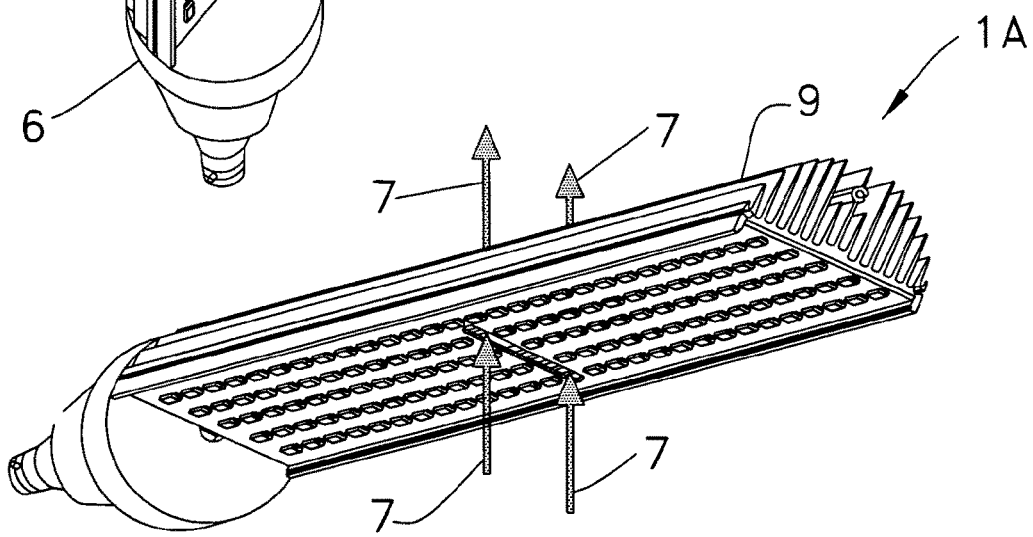
FIG. 3C shows an assembled perspective view of a LED lighting device in a horizontal position.

FIG. 3C shows an assembled perspective view of a First Embodiment LED lighting device in a vertical position similar to device illustrated in FIGS. 1 thru 3. Note that a slot 9a has been added, as shown in FIG. 3B. Air currents 7 can now pass right thru the heatsink assembly at the mid-point and bring in fresh cooling air, thus increasing the overall efficiency of the said heatsink assembly. Laboratory experiments have proven this invention to work. For example, adding only two of such slots as illustrated in the previous few paragraphs resulted in an overall reduction of heat sink temperature of approximately 10-15° C. This may seem a little, but it is not; lowering a temperature even slightly can increase LED life substantially.

Second Embodiment of the Present Invention

Figure 4:
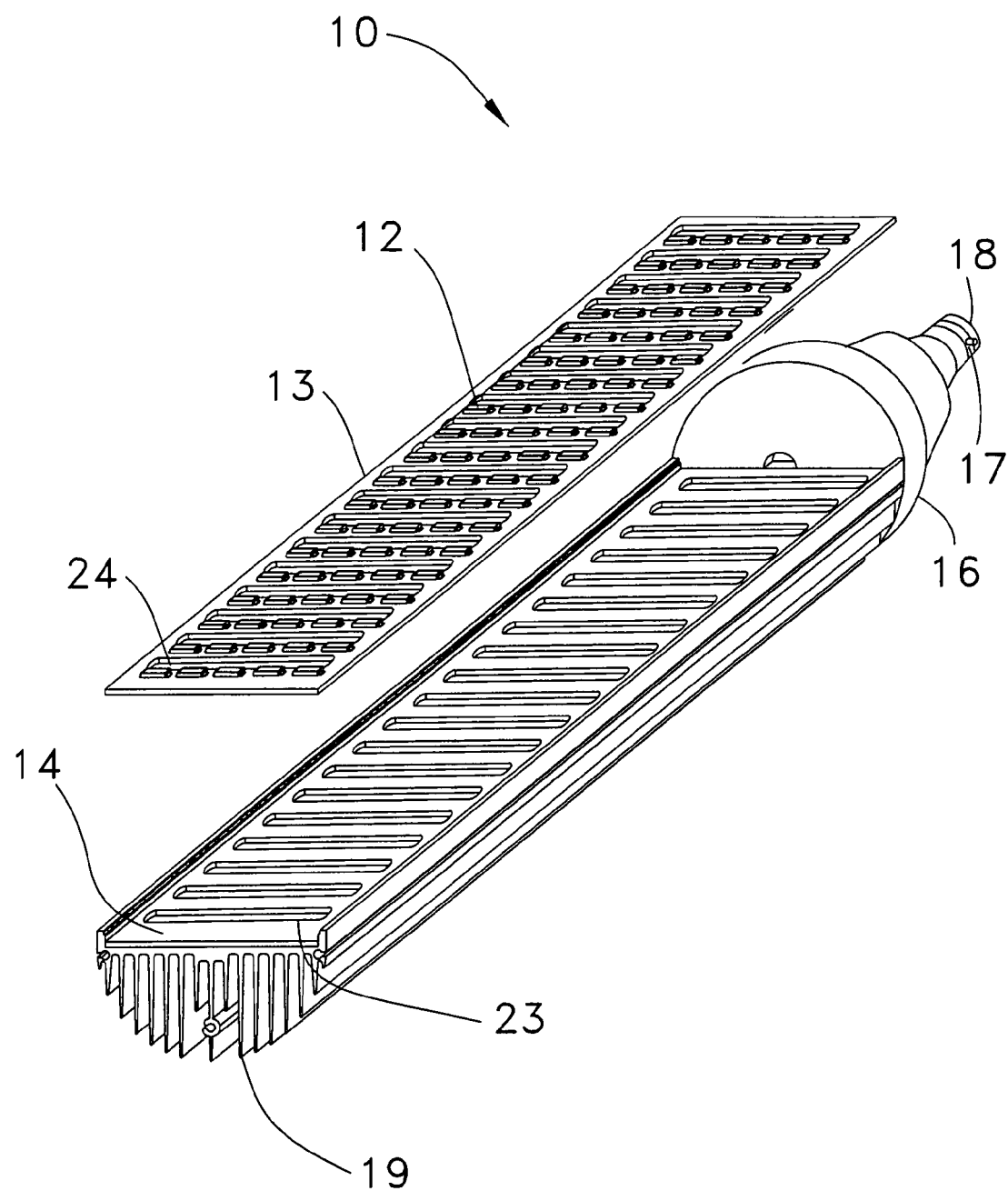
FIG. 4 shows a partially exploded perspective view of a Second Embodiment LED lighting device.

FIG. 4 shows a partially exploded perspective view of a Second Embodiment LED lighting device 10 consisting of a metal clad printed circuit board 13 with an array of LEDs 12 mounted transversely thereon as compared to the First Embodiment. Shown below the said items is an extruded aluminum heat sink 19 with a generally flat surface 14 which is mechanically attached to a housing 16 which is attached to a bayonet base 18 containing two locating lugs 17. The bayonet base illustrated is a type B22d. However, this teaching is not limited to the said bayonet base. As can be seen in FIG. 4 and subsequent figures, the LEDs 12 are now situated transversely as compared to the First Embodiment. This is to allow slots 24 to be cut thru printed circuit board 13 for reasons explained hereafter. Extruded aluminum heat sink 19 with a generally flat surface 14 now has been post machined with transverse slots 23 in the said PCB deep enough to expose the bottoms of the heat sink 19 fins. This embodiment illustrates an extreme example of multiple slots for a large heat dissipating capability.

Figure 4A:
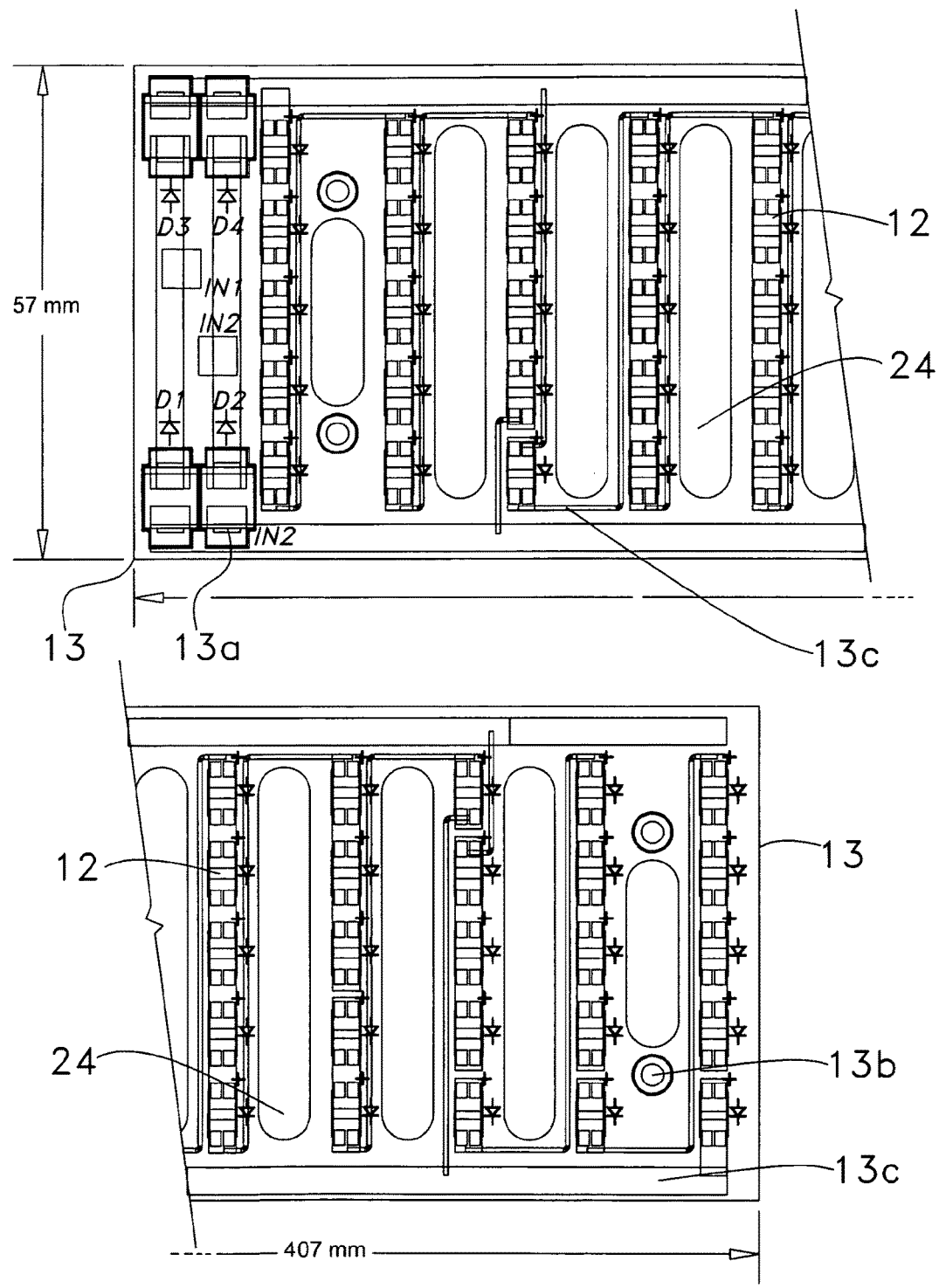
FIG. 4A shows an example PCB layout of a Second Embodiment LED lighting device.

FIG. 4A shows a view of a Second Embodiment LED lighting device PCB layout in a partial sectional format to show traces connecting the various LEDs. PCB 13 is shown with slots 24, mounting holes 13b, and electrical traces 13c. PCB dimensions are shown as an example, being 57 mm width and 407 mm length. LEDs 12 are shown with their diode symbols to the immediate right of each LED. To the untrained eye, traces 13c are a little difficult to see, but a PCB designer would immediately recognize them. On the top section are pads labeled IN1 and IN2. Also D1, D2, D3, D4 are steering diodes ensuring that the LED array always receives the correct voltage polarity regardless of the IN1 and IN2 power connection polarity. This example is illustrates clearly that a multiply slotted PCB is indeed possible and practical. The 407 mm length PCB is only one example shown. LED array panels of this general type have been made with lengths of up to two or three meters.

Figure 5:
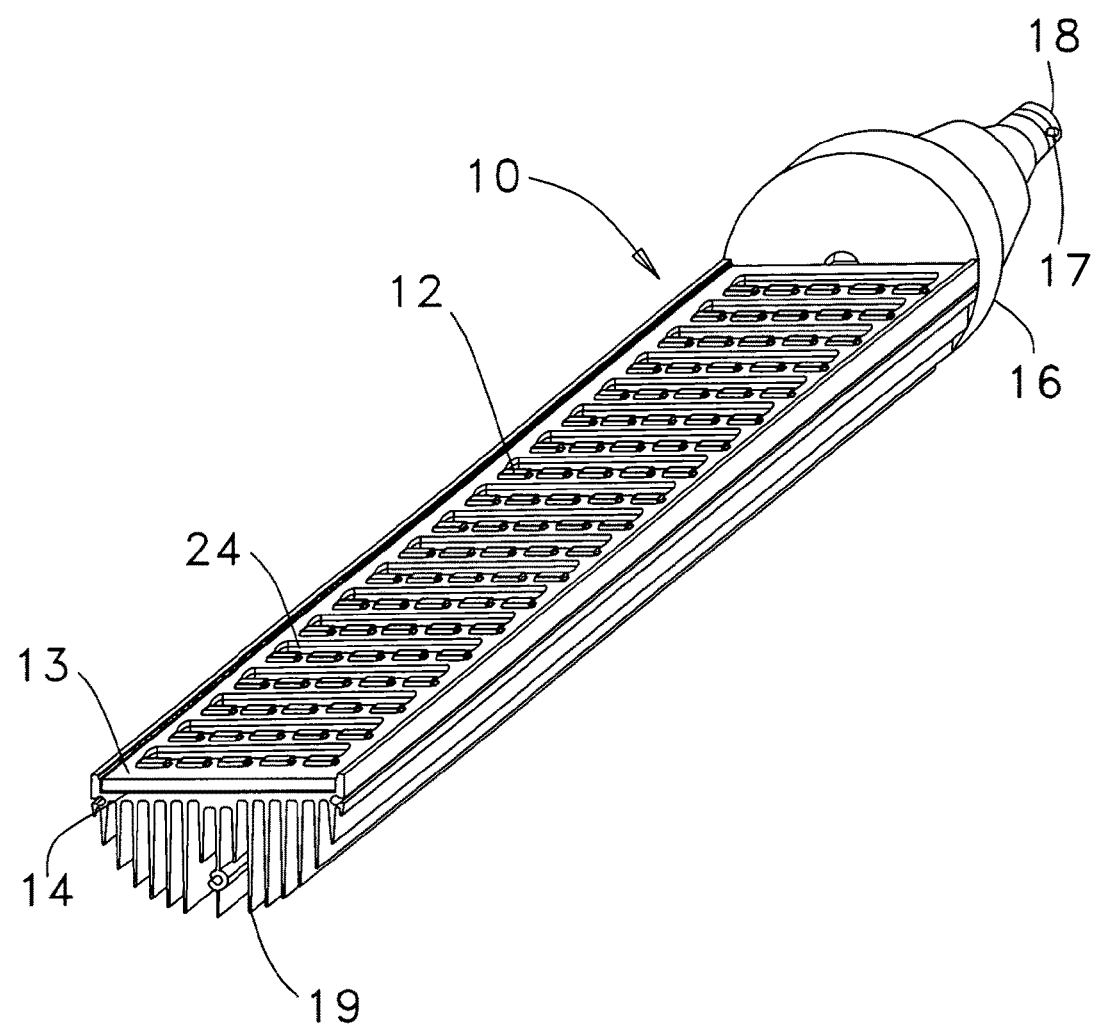
FIG. 5 shows an assembled perspective view of a Second Embodiment LED lighting device.

FIG. 5 shows an assembled perspective view of a Second Embodiment LED lighting device 10 consisting of a metal clad printed circuit board 13 with an array of LEDs 12 mounted transversely thereon as compared to the First Embodiment. Shown below the said items is an extruded aluminum heat sink 19 with a generally flat surface 14 which is mechanically attached to a housing 16 which is attached to a bayonet base 18 containing two locating lugs 17. The bayonet base illustrated is a type B22d. However, this teaching is not limited to the said bayonet base.

As can be seen in FIG. 5 and subsequent figures, the LEDs 12 are now situated transversely as compared to the First Embodiment. This is to allow slots 24 to be cut thru printed circuit board 13 for reasons explained hereafter. Extruded aluminum heat sink 19 with a generally flat surface 14 which has been post machined with said transverse slots matching the said slots 24 in the said PCB deep enough to expose the bottoms of the heat sink 19 fins. Slots 23 from FIG. 4 are now directly below the matching slots 24 on the PCB. Notice that the heat dissipating area of heat sink 19 has not been disturbed too much and there is still ample flat surface 14 left for conductive heat bonding to the PCB.

Figure 6:
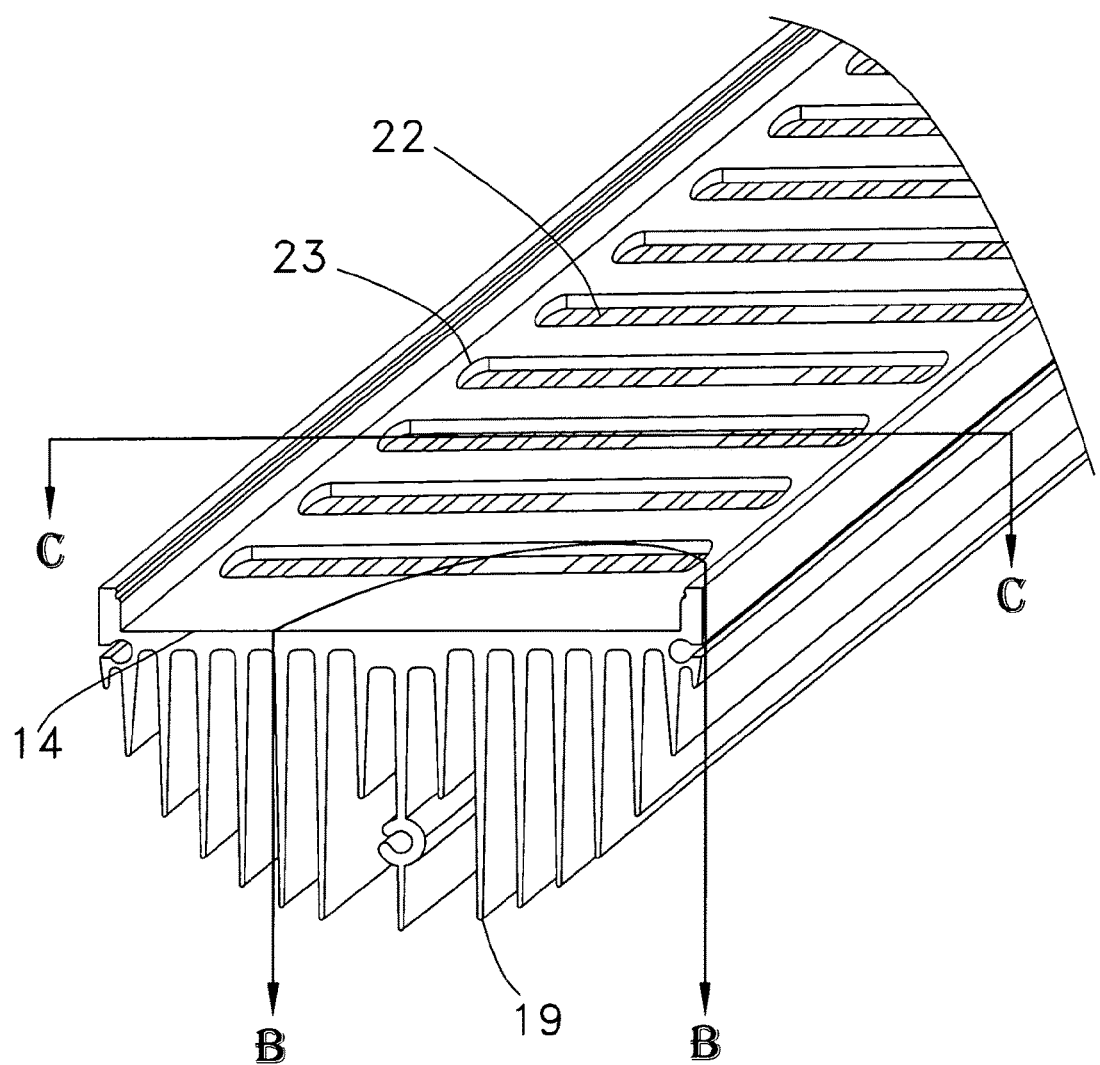
FIG. 6 shows a perspective sectional view of a Second Embodiment LED lighting device heat sink.

FIG. 6 shows a perspective sectional view of a Second Embodiment LED lighting device heat sink. Sectional views B-B and C-C will now be discussed.

Figure 7:
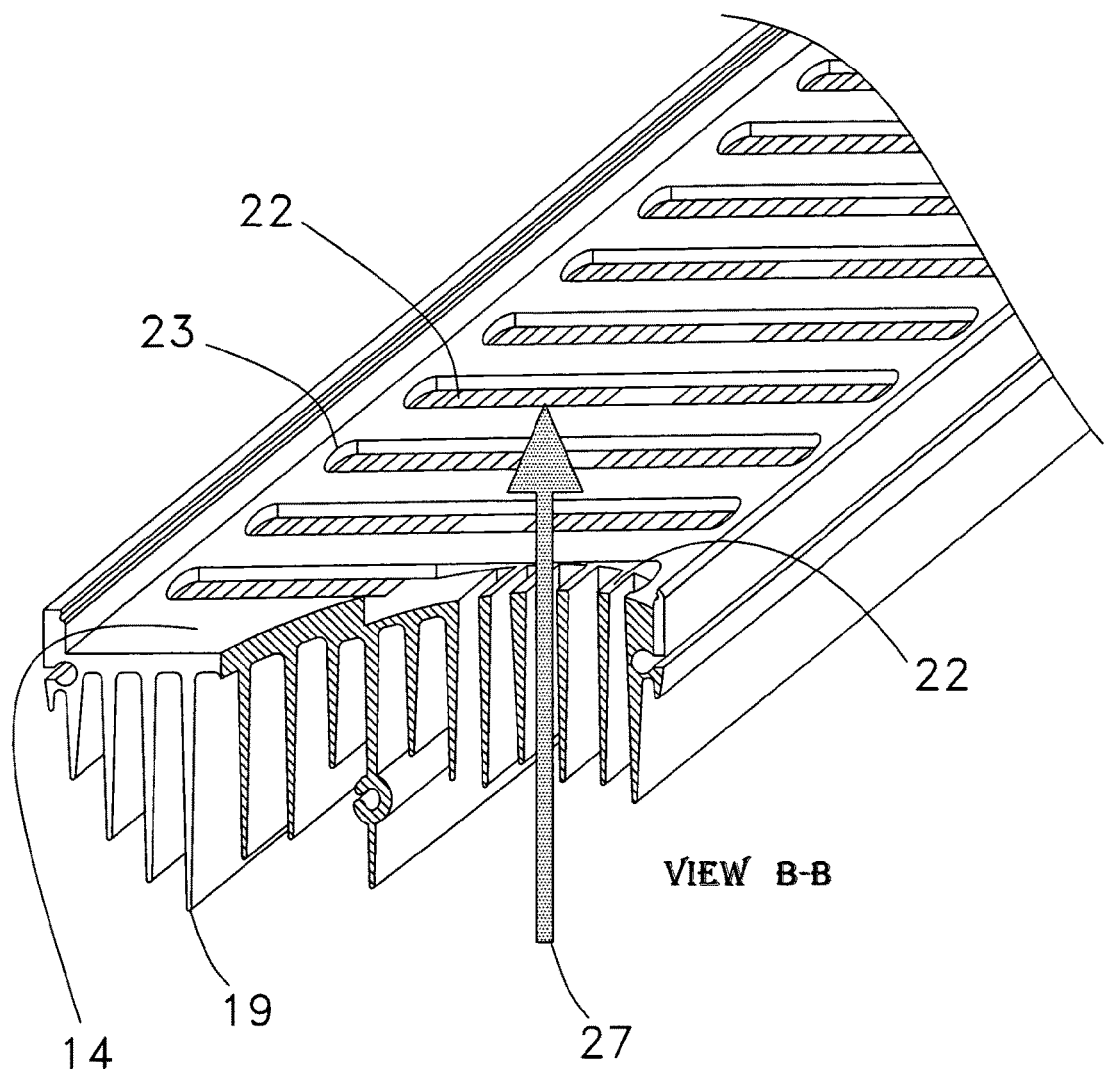
FIG. 7 shows a second perspective sectional view of a Second Embodiment LED lighting device heat sink.

FIG. 7 shows a second perspective sectional view of a Second Embodiment LED lighting device heat sink with section B-B details. When in an operational heated condition, the heat sink 19 will cause air currents to flow upwards. Unlike the conditions described in the first embodiment we now have a far more efficient air current flow. One of the basic tenets of convective heat transfer is short thermal paths and air velocity and turbulence. Here we have achieved these to a reasonable degree. The air current depicted by arrow 27 traverses right thru the slot in the PCB (24 in FIG. 5) and the slot 23 on said heat sink 19 and then passes past the exposed fins 22 and on out. Additionally, the sharp edges of the slots produce a variety of micro turbulent effects, aiding in heat transfer between the air and the metal heat sink. In the American vernacular, get the air in, grab some heat from the heat sink and "get out of Dodge" and allow a fresh current of air to come in and repeat the process. The inventor has dubbed this process "Short Path Heat Transfer"

Figure 8:
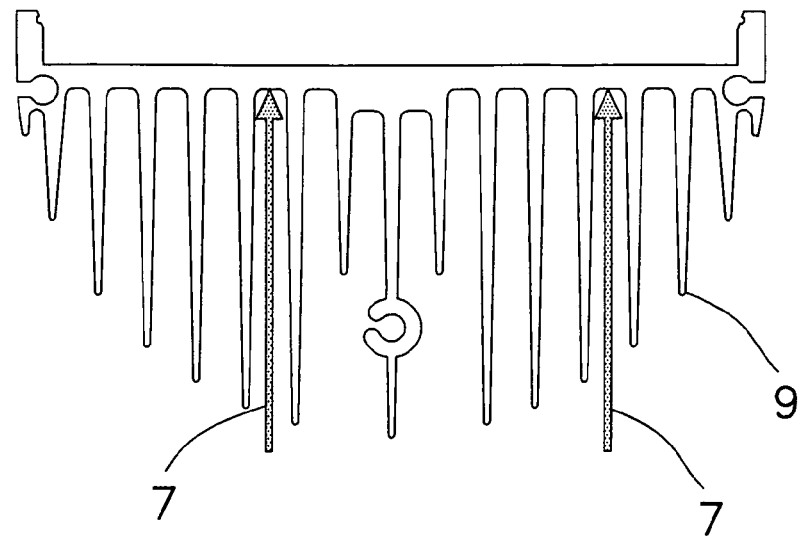
FIG. 8 shows an end view of a First Embodiment LED lighting device heat sink.

FIG. 8 shows an end view of a First Embodiment LED lighting device heat sink.

Figure 9:
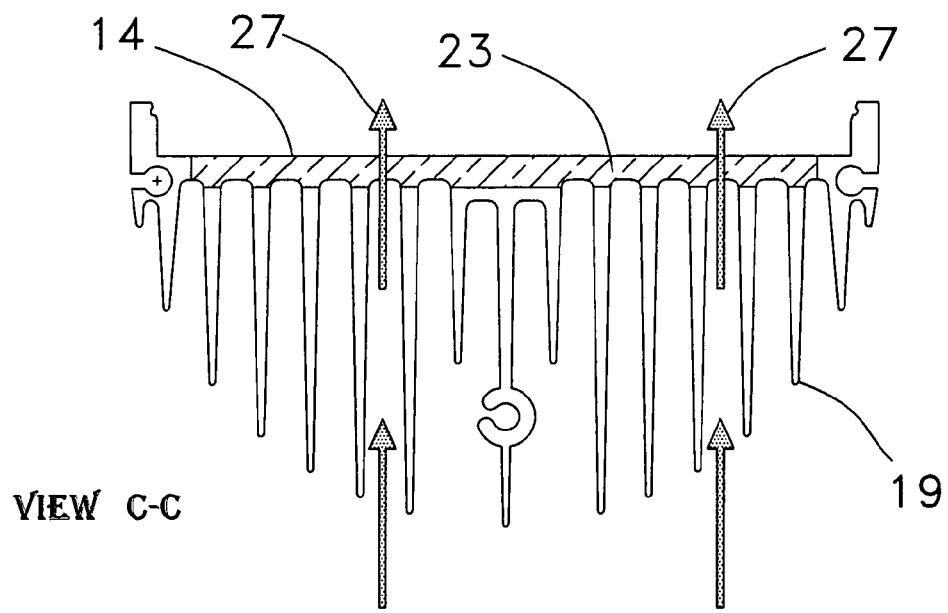
FIG. 9 shows an end view of a Second Embodiment LED lighting device heat sink.

FIG. 9 shows a sectional end view C-C of a Second Embodiment LED lighting device heat sink. The arrows 7 and 27 speak for themselves. In the former case as shown in FIG. 8, no air currents 7 can flow thru heat sink 9. In the latter case shown in FIG. 9, however, air currents 27 do flow fast and free thru heat sink 19 via the slot 23 (shown with a cross hatch for easy identification), cut into the surface 14 of heat sink 19.

Third Embodiment of the Present Invention

Figure 10:
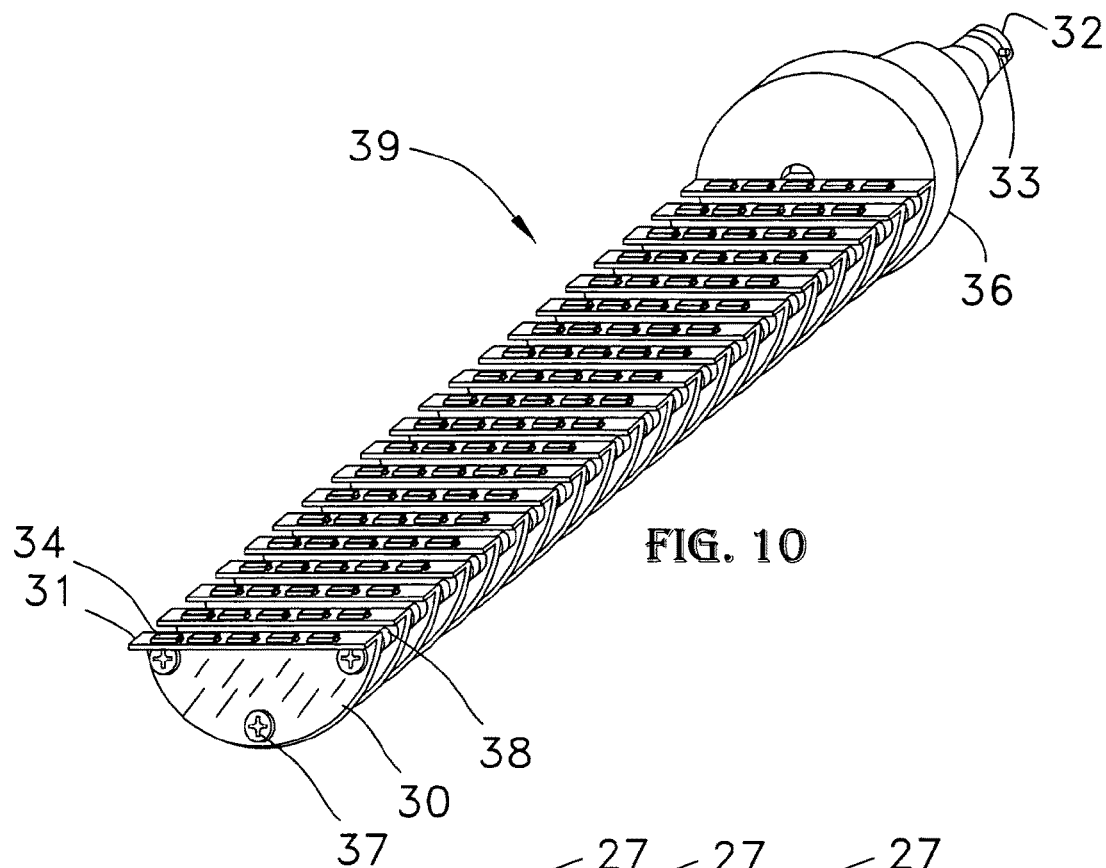
FIG. 10 shows an assembled perspective view of a Third Embodiment LED lighting device.

FIG. 10 shows an assembled perspective view of a Third Embodiment LED lighting device 39. It consists of a plurality of individual heat sink fins 30 with LEDs 34 mounted on the bent portions of heat sink fins 30. The entire assembly is fastened to housing 36, bayonet base 32 containing two locating lugs 33. The entire heatsink and LED assemblies are fastened to the housing using appropriate fasteners 37 and spacers 38 as shown in FIG. 10.

PCBs, will no longer be shown in further descriptions to not overcrowd the illustrations and the cost effective manufacturing and wiring technique will not be discussed since it is well known in the art.

The heat sink fins 30 with their bent portion are now not extrusions but stamped metal devices. The said stamped metal can be the metal clad PCB material used in previous embodiments or conventional thin sheet metal with the LEDs 34 mounted electrically insulated from the heat sink fins 30, but thermally conductive. A variety of techniques are known in the art. Serial/parallel electrical connections to the LED arrays are also well known in the art and need not be discussed herein. For example all the LEDs 34 could be solder flowed on one appropriately slotted PCB and then the said PCB LED assembly is solder flowed to all the said heatsinks fins 30 in one manufacturing operation using various assembly jigs etc.

Figure 11:
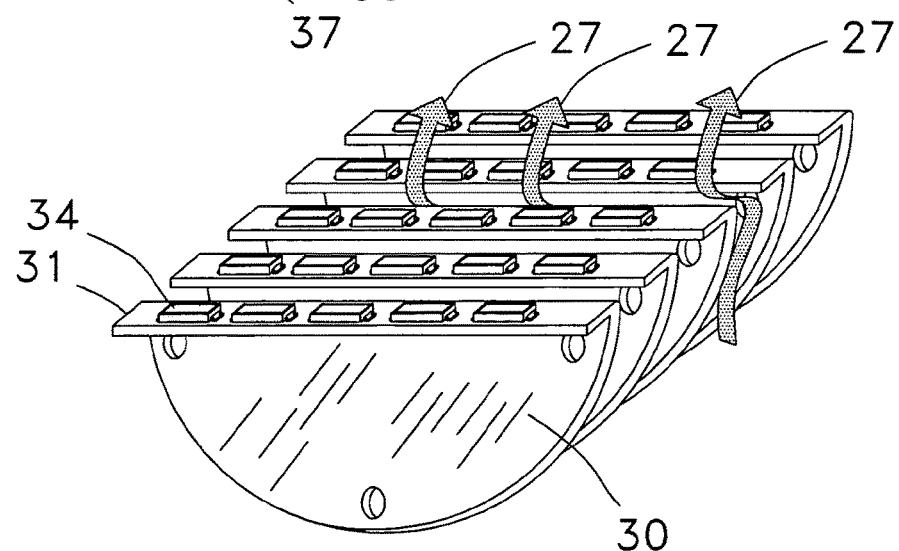
FIG. 11 shows a partial assembled perspective view of a Third Embodiment LED lighting device.

FIG. 11 shows a partial assembled perspective view of the said Third Embodiment LED lighting device 39 of FIG. 10. Air currents depicted by arrows 27 can be seen to flow freely cooling each LED 34 heat sink 30 segment. This short path fast air flow device has proven to be very efficient.

Generally each heat sink 30 segment is should be sized to have an area of 30 to 45 square centimeters per Watt of total led power dissipation on each heatsink fin 30 segment. This is a tall order in many respects for a single fin. The next Fourth Embodiment helps us out here by doubling the fin area. It is important to note that the LEDs must be at a fairly higher temperature than the environment for heat transfer to occur. So it is a cool-me-if-you-can game between the LED and the thermal engineer. Enough said; it is all in the skill of the art.

Fourth Embodiment of the Present Invention

Figure 12:
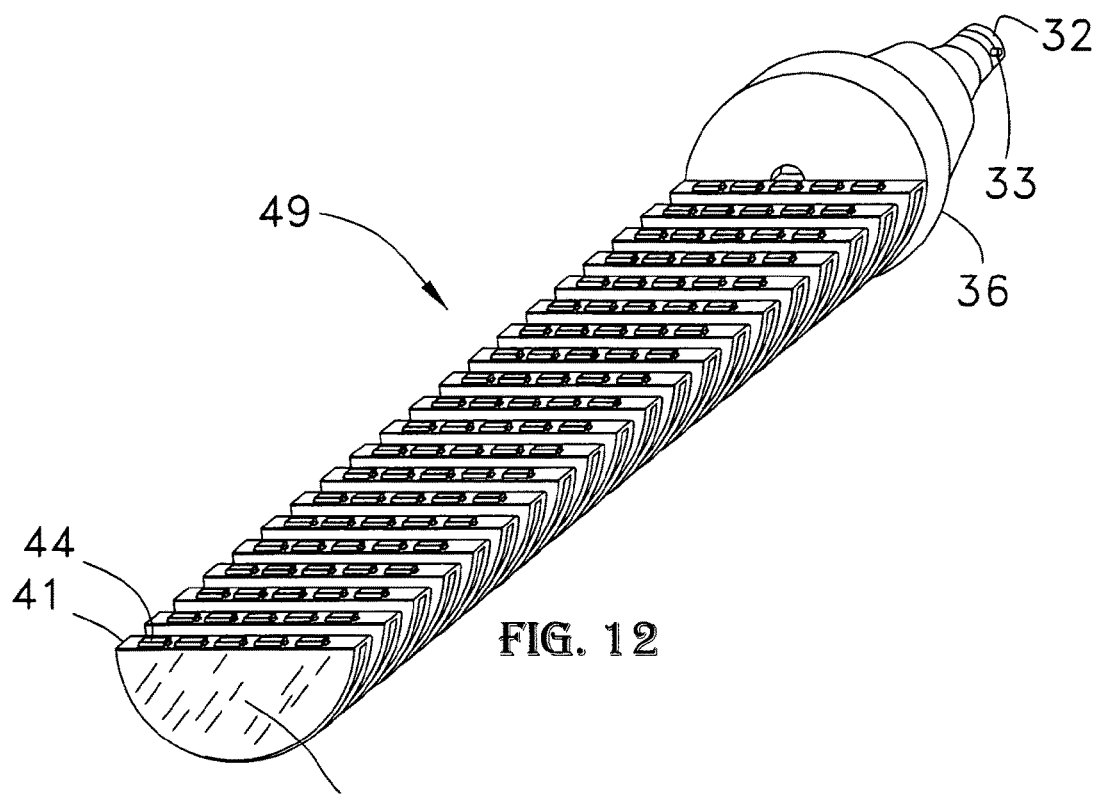
FIG. 12 shows an assembled perspective view of a Fourth Embodiment LED lighting device.

FIG. 12 shows an assembled perspective view of a Fourth Embodiment LED lighting device 49. It consists of a plurality of individual heat sink fins 40 with LEDs 44 mounted on the double bent portions of heat sink fins 40. The entire assembly is fastened to housing 36, bayonet base 33 containing two locating lugs 33, using appropriate fasteners and spacers (not shown). The cost effective manufacturing and wiring technique will not be discussed since it is well known in the art. The heat sink fins 30 with their double bent portion are now not extrusions but stamped metal devices. The said stamped metal can be the metal clad PCB material used in previous embodiments or thin sheet metal with the LEDs 44 mounted electrically insulated from the double heat sink fins 30, but thermally conductive. A number of techniques are known in the art.

Figure 13:
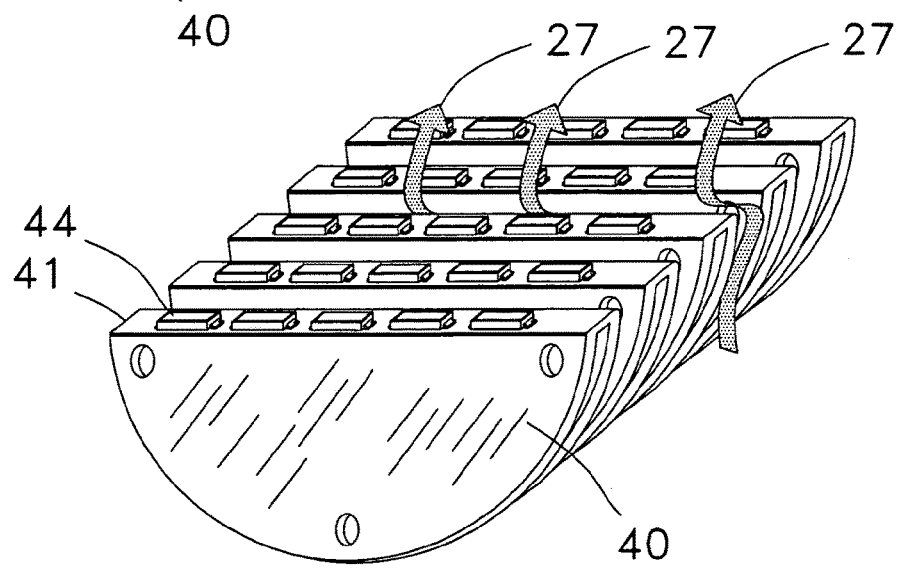
FIG. 13 shows a partial assembled perspective view of a Fourth Embodiment LED lighting device.

FIG. 13 shows a partial assembled perspective view of the said Fourth Embodiment LED lighting device 41. Air currents depicted by arrows 27 can be seen to flow freely cooling each LED 44 heat sink 40 segments. This short path fast air flow device has proven to be very efficient. This fourth embodiment has a higher power dissipation capability than the third embodiment due to the double surface area of the heat sink 40.

Fifth Embodiment of the Present Invention

Figure 14:
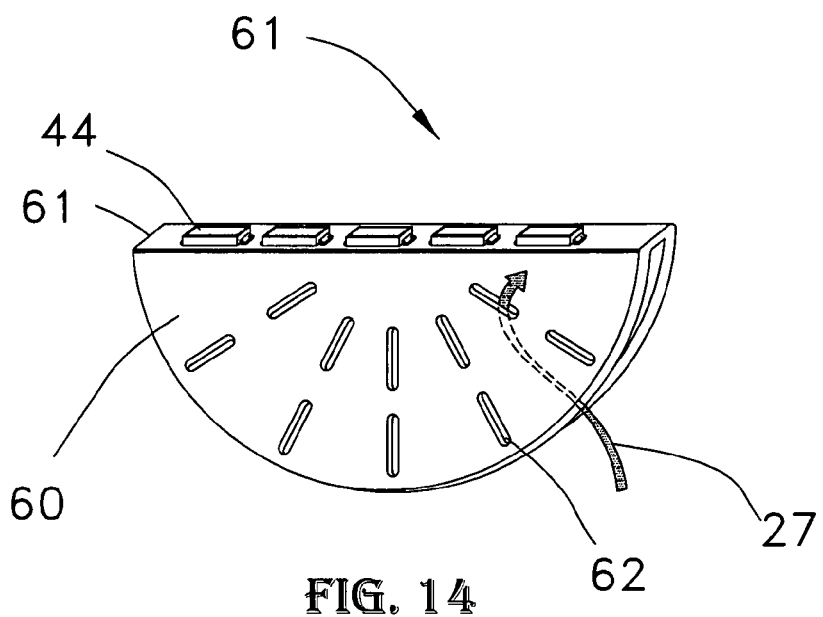
FIG. 14 shows a one-section perspective view of a Fifth Embodiment LED lighting device.

FIG. 14 shows a one section perspective view of a Fifth Embodiment LED lighting device 61. It is identical to the sections in FIG. 12 with the exception that slots 62 have been added. Now then the neophyte will say "adding slots reduces the heat sink area". Not so; if the slot width is the same as the heat sink fin thickness, the area is increased by the added annular area of the heat sink fin thickness . . . . Herein we set forth the explanation. Let us imagine a heat sink fin that is one tenth of an inch thick. For easy mental calculation, let's cut a rectangular slot one tenth of an inch wide and one inch long. Now from each side of the said fin we have removed:

(0.10×1.0)inches+(First side of rectangular surface)

(0.10×1.0)inches+(Second side of rectangular surface)=0.02 square inches

However we have exposed the inner thickness of the said fin thus:

(0.10×1.0)inches+(First long thickness side of rectangular opening)

(0.10×1.0)inches+(Second long thickness side of rectangular opening)

(0.10×0.10)inches+(First short thickness side of rectangular opening)

(0.10×0.10)inches+(Second short thickness side of rectangular opening)=0.022 square inches Now therefore, we have created a heat sink fin 60 which is slightly better in area and allows more free airflow as depicted by arrow 27. Additionally, the sharp edges of the slots produce a variety of micro turbulent effects increasing convective heat transfer. Moving air turbulence disrupts laminar air flow which in turn achieves better convective heat transfer. The slot population density is limited by the heat sink fin 60's thermal conductivity since slotting interferes with the said fin's conductive heat transfer. So for example, if the fin was copper, it could have twice the number of slots as aluminum since copper has roughly two times better heat conduction. Also slot orientation is important. Notice that FIG. 14 shows the slots in a radial pattern. This not an accident; this configuration allows fin 60 heat conduction to radiate out radially and thus the slots 62 will be supplied with ample heat from its source which is the top portion where the LEDs 44 are located.

Although the inventor demonstrates that heat sink area can be maintained when slots, holes or other shape of openings are properly applied, there may be other cases where a relatively small reduction of heat sink area may be allowed if the cooling advantages outweigh the loss of said heat sink area and are hereby incorporated by reference. As a general note, when dealing with a heatsink base that has fins attached to the said base, it is not necessary to maintain the same exposed surface area of the said base because the primary function of the base is to conduct heat to the fins, not to dissipate the majority of the heat. This is why the said base is usually much thicker than the fins. However when slots, holes or other shape of openings are placed on the fins, maintaining the surface area is important. Even so, the said slots, holes or other shape of openings can be larger if experiment shows that air flow is improved and heat dissipation is increased. It's all in the art of the thermal science involved and laboratory experimentation, and therefore these described techniques are incorporated by reference.

Sixth Embodiment of the Present Invention

Figure 15:
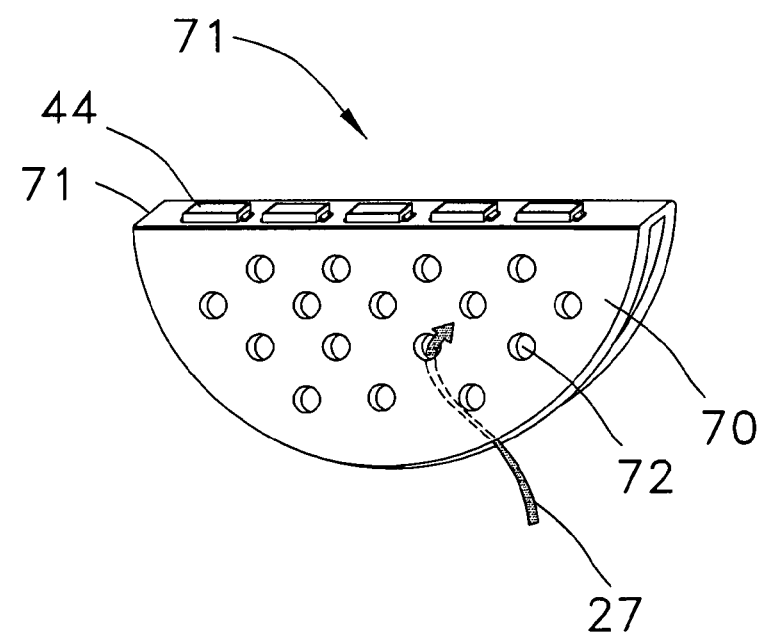
FIG. 15 shows a one-section perspective view of a Sixth Embodiment LED lighting device.

FIG. 15 shows a one section perspective view of a Sixth Embodiment LED lighting device 71 wherein a plurality of holes have been added instead of slots. With judicious hole 72 sizing and number and placement of said holes, this heat sink 70 has the greatest potential for efficient short path air circulation. Once again arrow 27 illustrates the short path air flow.

Seventh Embodiment of the Present Invention

Figure 15A:
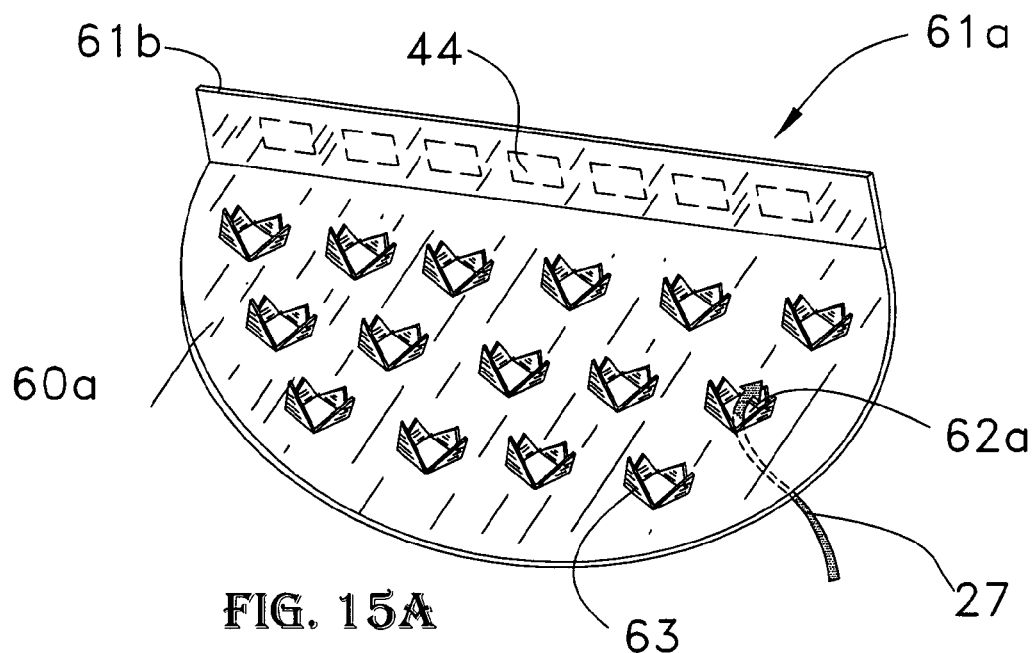
FIG. 15A shows a one-section perspective view of a Seventh Embodiment LED lighting device.

FIG. 15A shows a one section perspective view of a Seventh Embodiment LED lighting device 61a wherein a plurality of openings have been made using a metal piercing technique which does not remove any metal such as in drilling or punching holes. Once again, heatsink area is increased and air flow is improved. The view in FIG. 15A is reversed for clarity. The LEDs 44 are distal, mounted on L bend 61b, hence the dashed lines indicating their presence. The heatsink fin 60a is pierced with a plurality of openings 62a thru which air can circulate. When the heat sink fin 60a is pierced by a hardened tool spike that generally is shaped like a sharp nail point, an opening 62a is forced into the metal fin 60a. Additionally, triangular segments 63 are also produced which once again give rise to increased exposed surface area due to the triangular segments 63 thickness sections. Arrow 27 illustrates air flow thru opening 62a.

Eighth Embodiment of the Present Invention

Figure 15B:
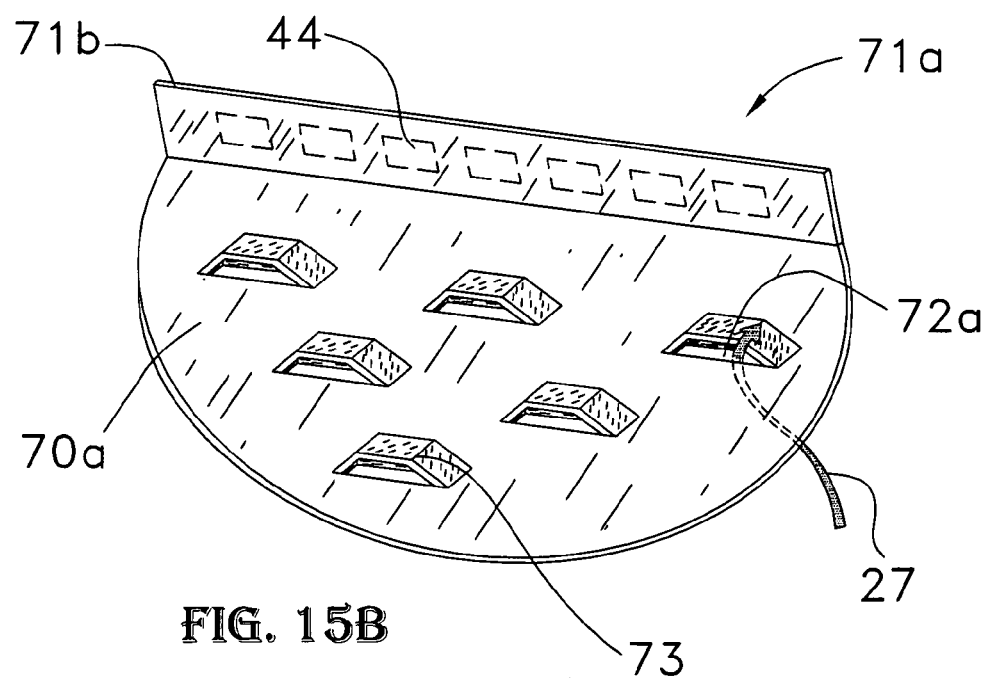
FIG. 15B shows a one-section perspective view of a Eighth Embodiment LED lighting device.

FIG. 15B shows a one section perspective view of a Eighth Embodiment LED lighting device 71a wherein a plurality of openings have been made using a metal stamping technique which does not remove any metal such as in drilling or punching holes. Once again, heatsink area is increased and air flow is improved. The view in FIG. 15B is reversed for clarity. The LEDs 44 are distal, mounted on L bend 71b, hence the dashed lines indicating their presence. The heatsink fin 70a is pierced with a plurality of openings 72a thru which air can circulate. When the heat sink fin 70a is stamped with a hardened stamping and partial punching tool, an opening 72a is forced into the metal fin 70a. Additionally, bridge-like segments 73 are also produced which once again give rise to increased exposed surface area due to the bridge-like segments 73 thickness sections. Arrow 27 illustrates air flow thru opening 72a.

Ninth Embodiment of the Present Invention

Figure 16:
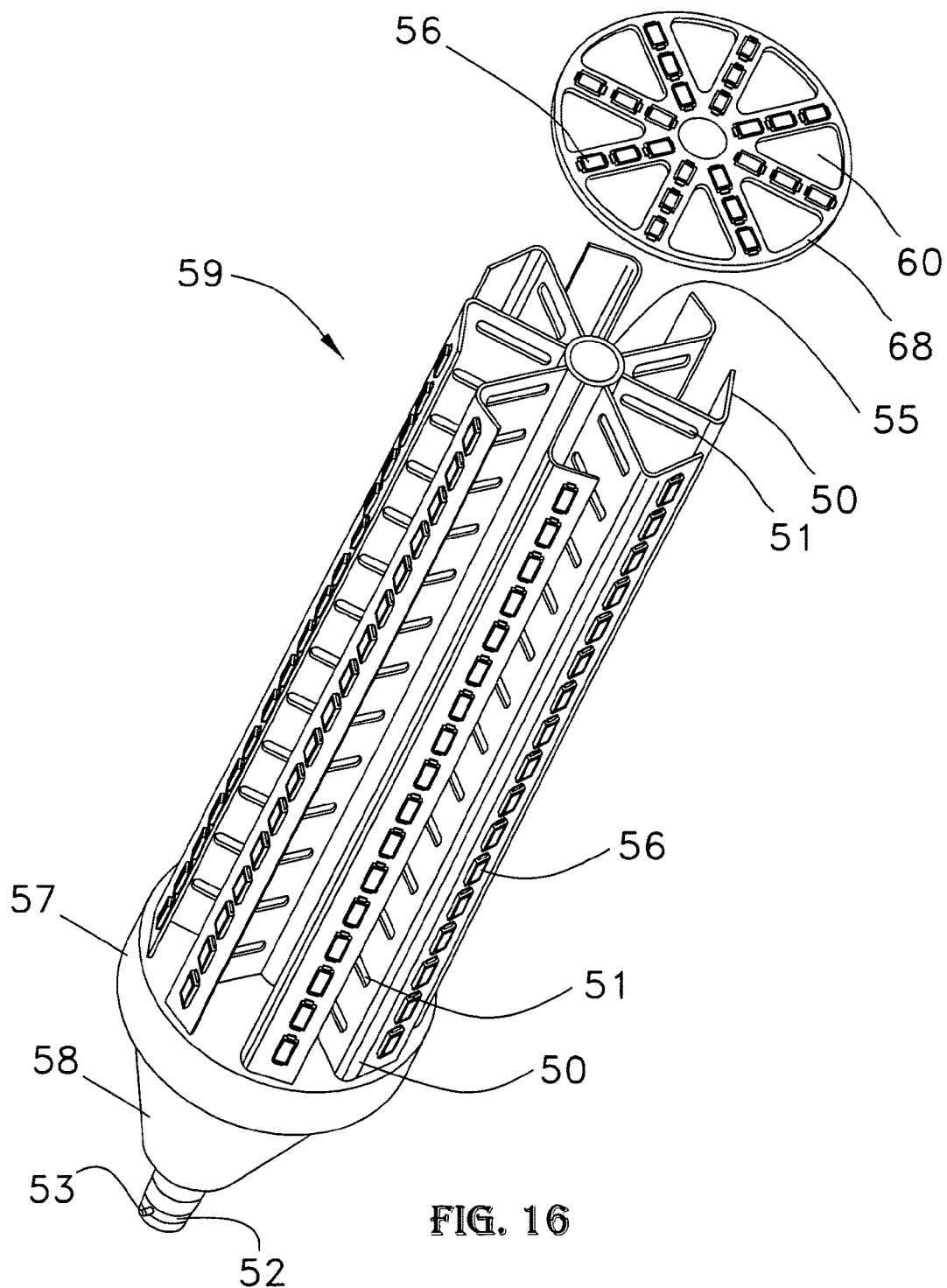
FIG. 16 shows a partially exploded perspective view of a Ninth Embodiment LED lighting device.

FIG. 16 shows a partially exploded perspective view of a Ninth Embodiment LED lighting device 59. Its purpose is to produce a lighting device as the previous embodiments, but having an omnidirectional light emission capability. It consists of heat sink sections 50 with slots 51, and LEDs 56 mounted on bent portions of said heat sinks 50 which are fastened to a central hub 55. The said assembly is attached to a housing rim 57 which is an integral part of housing 58 with a base bayonet 57 with two prongs 53. As in previous illustrations, the bayonet base illustrated is a type B22d. However, this teaching is not limited to the said bayonet base. An LED 56 embellished end cap 68 is also shown exploded from the fixture 59 for clarity. When assembled, the top cap 68 is edge bonded to the plurality of heat sinks 50 using thermally conductive epoxy or the like to thermally couple the LEDs 56 on said top cap to the plurality of heat sinks 50. To not impede airflow, a plurality of openings 60 is also shown. Once again, electrical connections are not shown; they are well known in the art. The base portion 58, 57 can contain ballast electronics which are also well known in the art and are not illustrated.

Figure 17:
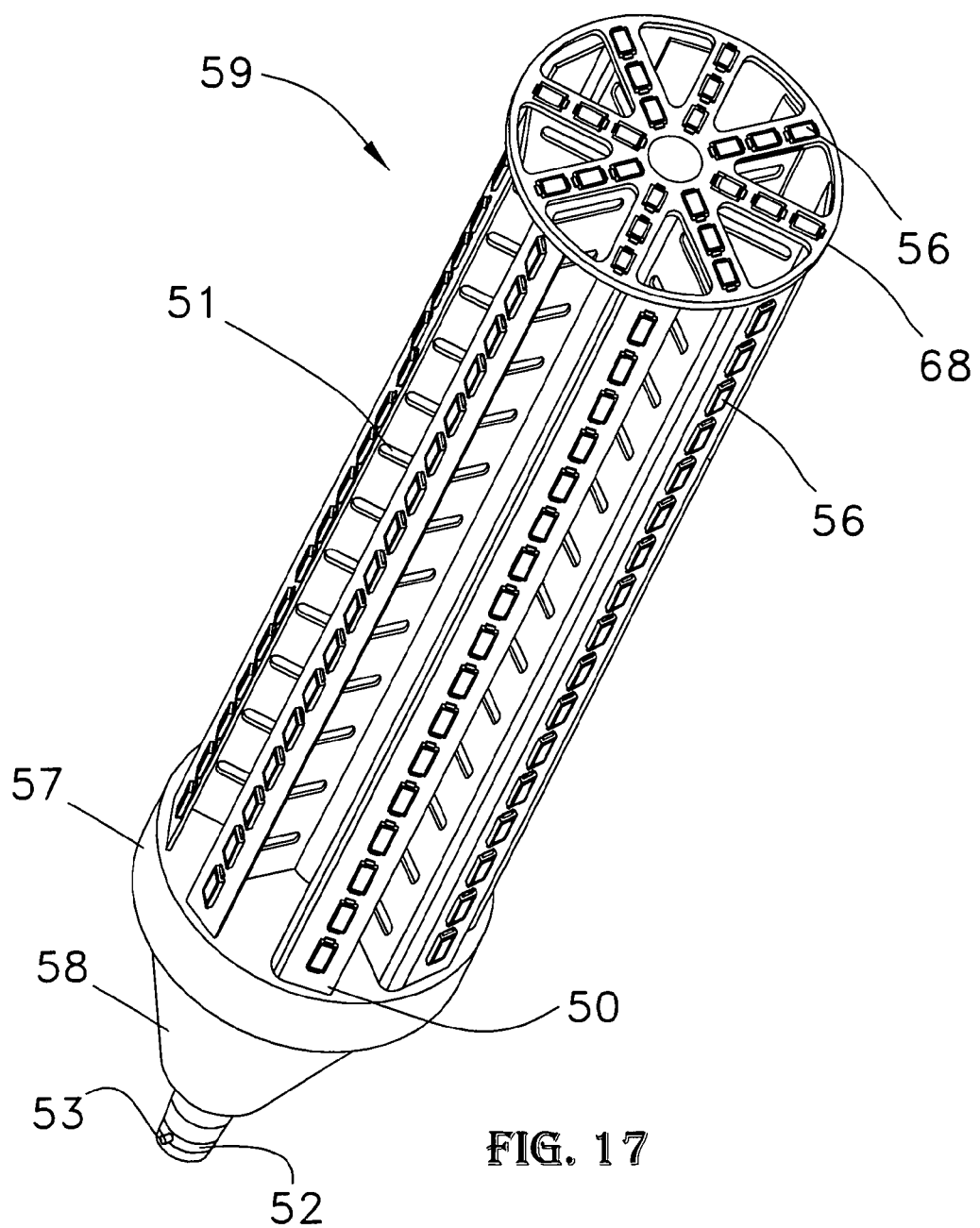
FIG. 17 shows an assembled perspective view of a Ninth Embodiment LED lighting device.

FIG. 17 shows an assembled view of the Ninth Embodiment LED lighting device 59. The slots 51 are carefully designed so as to keep the heat sink area the same as discussed previously. This Ninth Embodiment LED lighting device 59 is capable of very efficient heat dissipation. As mentioned previously, when assembled, the top cap 68 is edge bonded to the plurality of heat sinks 50 using thermally conductive epoxy or the like to thermally couple the LEDs 56 on said top cap 68 to the plurality of heat sinks 50. A transparent perforated plastic cover is generally used with this lighting device 69. (Not shown here, but is illustrated in FIG. 18A).

Tenth Embodiment of the Present Invention

Figure 18:
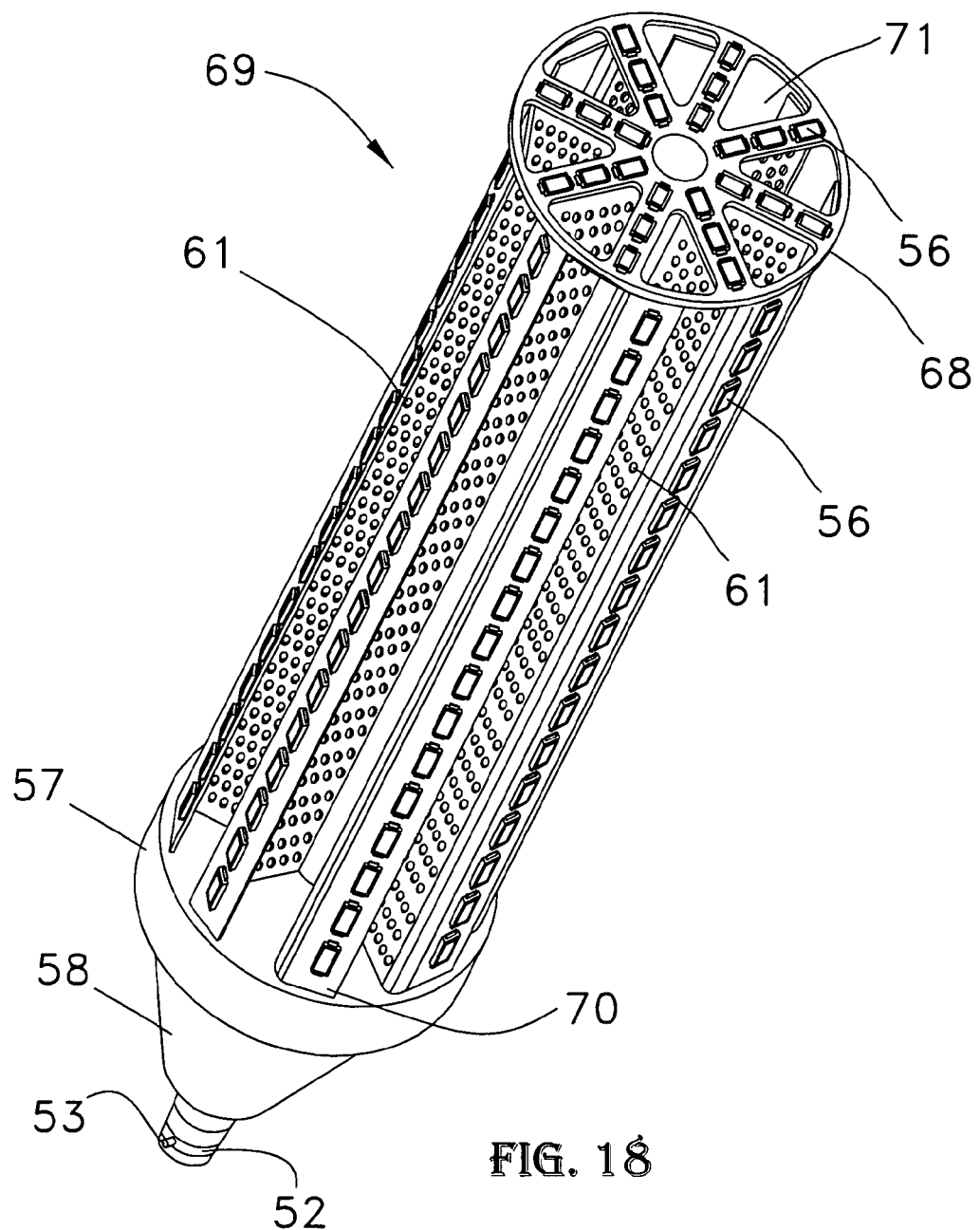
FIG. 18 shows an assembled perspective view of a Tenth Embodiment LED lighting device.

FIG. 18 shows an assembled view of the Tenth Embodiment LED lighting device 69, wherein the plurality of heat sinks 70 are made from preferably, but not limited to, perforated aluminum. The holes 61 are carefully designed so as to keep the heat sink area substantially the same surface area as discussed previously. This Tenth Embodiment LED lighting device 69 is capable of very efficient heat dissipation, even better than Embodiment Nine. The top cap 68 is edge bonded to the plurality of heat sinks 70 using thermally conductive epoxy or the like to thermally couple the LEDs 56 on said top cap to the plurality of heat sinks 70. A transparent perforated plastic cover is generally used with this lighting device 69. (Shown in FIG. 18A). The said plastic cover is also carefully designed, with little or no perforations in front of the LEDs, and large perforations between the heat sink 70 "wings". The top portion of the lighting device 68 is also covered by the same said cover and slotted in the triangular region 71 between the "star" patterned LEDs 56. The better this said lighting device can "breathe", the cooler it will run.

Figure 18A:
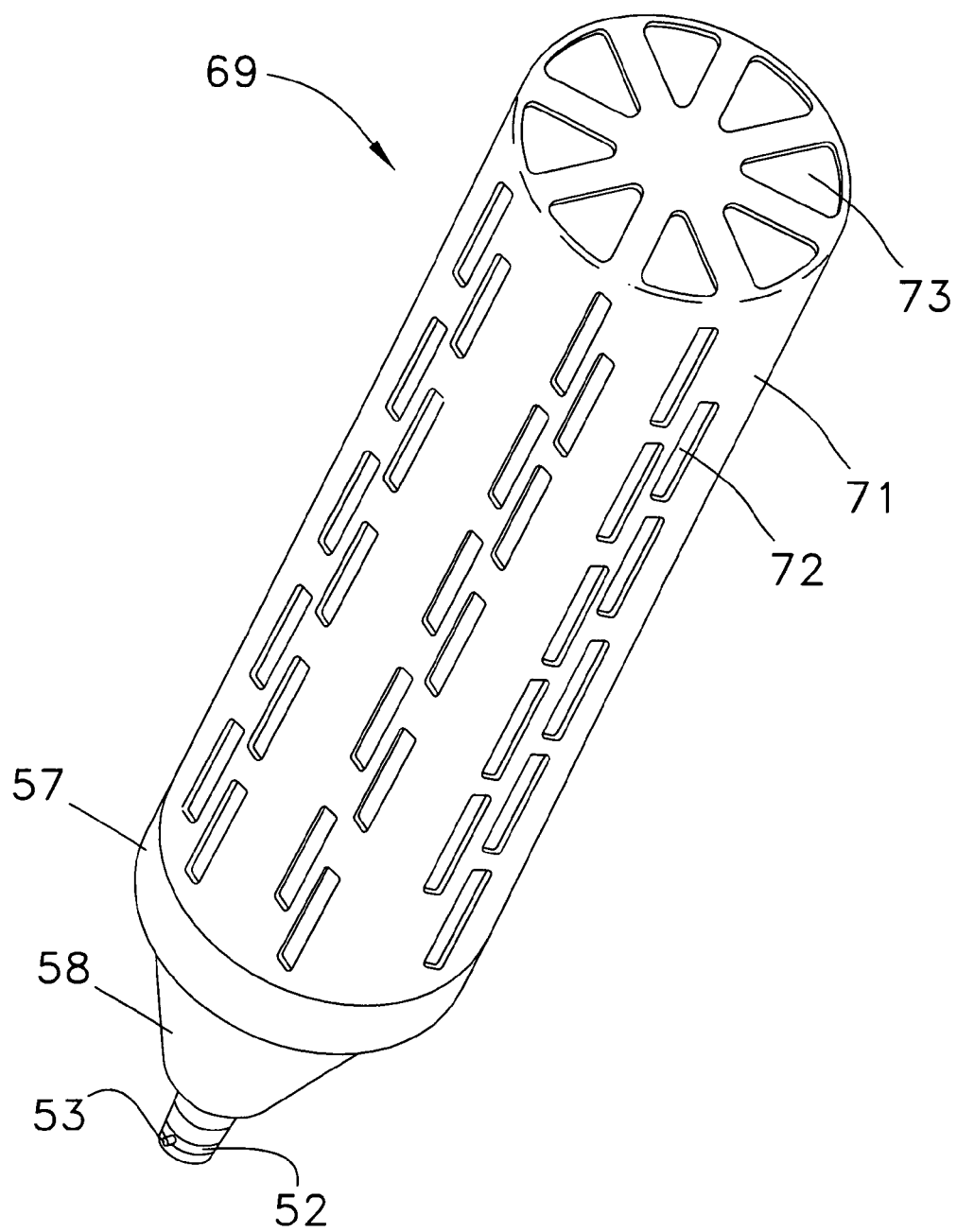
FIG. 18A shows a transparent or translucent protective plastic cover and base as can be optionally used in said Tenth Embodiment LED lighting device.

FIG. 18A shows an assembled view of the Eighth Embodiment LED lighting device 69, wherein none of the interior is shown. Only the transparent or translucent protective plastic cover 71 and base portion is illustrated. The said assembly is attached to a housing rim 57 which is an integral part of housing 58 with a base bayonet 57 with two prongs 53. The cover portion 71 contains a plurality of slots 72 designed to allow air to pass into and out of the LED light fixture. On the top portion are shown triangular openings 73 to allow air in or out as described for the said slots. Although slots and triangular openings are shown, this invention is not limited to this said configuration. During manufacturing, other constraints may apply, necessitating other types of openings and are hereby incorporated by reference. Additionally, the portions of the said plastic cover 71 can also have lenses molded in the areas directly in front of each LED for further light dispersion and is hereby incorporated by reference Other Applications of the Present Invention Heretofore the novel heat sink structure has been taught as applied to LED lighting devices. Nevertheless, in order to comply with the requirement to offer a full disclosure of the present invention, the inventor will now illustrate an alternate semiconductor cooling application.

FIG. 19 illustrates a perspective view of a horizontally positioned very common heat sink 80 as used by millions of electronic devices. It consists of a flat surface portion 88 with a plurality of fins 89. It is predominantly made by an aluminum extrusion process or a casting process. Mounted on the surface portion 88 are several power dissipating semiconductor devices 87. Under operation these devices 87 generate heat; which heat is conductively transferred to the heat sink 80 containing a plurality of fins 89. Air currents begin to flow as described in the description of FIG. 3. As shown by arrow 86, rising air currents cannot traverse thru the bottom surface 88 of heat sink 80 and diverge around the said heat sink 80. Complex micro air currents in and around the heat sink 80 fins 89 do a reasonable job of heat transfer to the ambient air.

Now therefore, the well understood science of heat transfer teaches us that still air has an extremely low thermal conductivity of about 0.026 W/mK, depending upon altitude, barometric pressure, humidity etc. However moving air has a much better heat transfer capability. Subsequently deep in the central inner parts of the heat sink 80 little air current movement is going on, hence the inefficiency of the heat sink 80.

Now let us discuss forced air cooling of the heat sink 80. According to Langmuir's laminar flow theory, smooth and even air flow over a surface does not result in efficient heat transfer due to a "boundary layer effect" wherein the air atomically close to the surface over which the air is flowing does not move. Thus heat transfer is radiative in nature from the surface to the moving air close above the said surface. How do we overcome this? If we cause the air movement to be turbulent, heat transfer is more efficient since the turbulence disrupts the boundary layer effect to a significantly large degree by a scrubbing action of irregular atmospheric motion especially when characterized by up-and-down micro current turbulence.

Air turbulence is greatly induced when air is pushed, and is less when air is sucked thru a heat sink's fins. As explained to this inventor by a seasoned aeronautical engineer several years ago, air molecules are to be likened to light ping pong balls that refuse to be pushed in the direction of the forced air, but can be easily sucked up by a vacuum cleaner. Pushing air causes turbulence, while sucking air tends towards smoother air flow.

Now if we introduce holes or slots in the heat sinks fins, further subtle effects occur. For example, moving air over a hole or slot will pull additional air thru these said slots or holes due to the "Bernoulli effect", further causing more air flow and turbulence due to "edge effects" thus creating better heat transfer. One type of "edge effect" occurs when moving air over an even surface suddenly passes over a sharp discontinuity on the said surface such as an edge or trough or channel etc. The moving air experiences a disruption and turbulence results, further disrupting laminar flow and convective heat transfer is augmented.

The above has been a greatly simplified explanation since a rigorous treatment of the subject would is beyond the scope if this teaching.

Eleventh Embodiment of the Present Invention

FIG. 20 illustrates a perspective view of an Eleventh Embodiment of the present invention. It consists of a horizontally positioned heat sink 90, a flat surface portion 98 with a plurality of fins 99. Mounted on the surface portion 98 are several power dissipating semiconductor devices 87. Under operation these devices 87 generate heat; which heat is conductively transferred to the heat sink 90 containing a plurality of fins 99. Air currents begin to flow; but this time thru the heat sink 90 via slots 95 as shown by arrow 96, past the exposed bottoms of the heat sink 90 fins 94. Now we have a faster air movement and cool air entering at the base of the said fins 94. This is a more efficient heat sink than the one in FIG. 19. Section D-D is removed and the remainder depicted in FIG. 21.

FIG. 21 illustrates a partial perspective sectional view of a horizontally positioned heat sink 90 as used in the present invention where the proximal section D-D depicted in FIG. 20 has been removed. It consists of a flat surface portion 98 with a plurality of fins 99. Mounted on the surface portion 98 are several power dissipating semiconductor devices 87. Under operation these devices 87 generate heat; which heat is conductively transferred to the heat sink 90 containing a plurality of fins 99. Air currents begin to flow; but this time thru the heat sink 90 via slots 95 as shown by arrows 96, past the exposed bottoms of the heat sink 90 fins 94. Now we have a faster air movement and cool air entering at the base of the said fins 94. The sectional view C-C shows the exposed fins 94 clearly. The depth of the slots 95 is just deep enough to expose the bottoms on the Fins 90. This is a more efficient heat sink than the one depicted in FIG. 19. Also, as noted earlier in these teachings, slots were shown on the heat sink 90. Holes or other shape of openings may be used depending on the engineer's design constraints and are hereby incorporated by reference.

As a note, the heat sinks 90 as depicted in FIGS. 20 and 21 do not have to be in a horizontal position; they are more efficient than heat sink 80 in other orientations. In the vernacular, we have allowed the heat sink 90 to "breathe" better.

Twelfth Embodiment of the Present Invention

Figure 22:
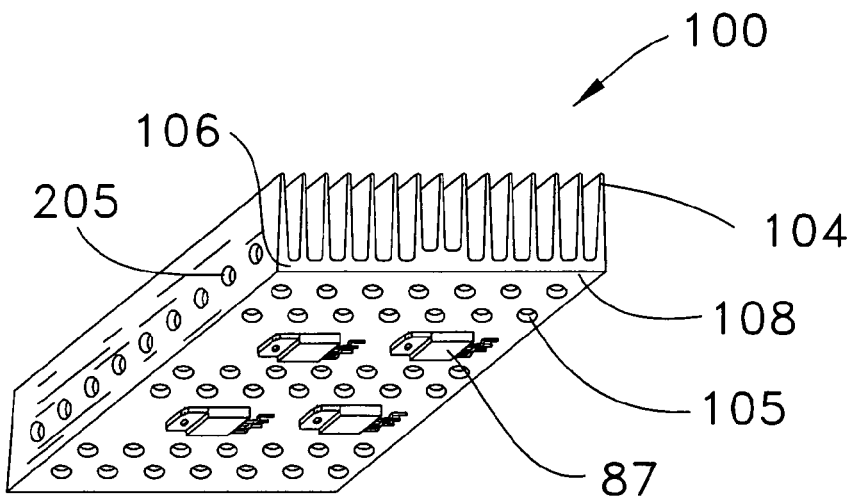
FIG. 22 illustrates a perspective view of a Twelfth Embodiment third horizontally positioned heat sink of the present invention.

FIG. 22 illustrates a Twelfth Embodiment of the present invention. It is a perspective view of a horizontally positioned heat sink 100 as used in the present invention. It consists of a flat surface portion 108 with a plurality of fins 104 and a plurality of holes 105 drilled deep enough to expose the bottoms of fins 104. Mounted on the surface portion 108 are several power dissipating semiconductor devices 87. Under operation these devices 87 generate heat; which heat is conductively transferred to the heat sink 100 containing a plurality of fins 104 with holes 105. Air currents begin to flow; but this time thru the heat sink 100 via holes 105, past the exposed bottoms of the heat sink 100 fins 104. Now we have a faster air movement and cool air entering at the base of the said fins 104. This is a more efficient heat sink than the one in FIG. 19. FIG. 22 also shows additional side holes 205 being added to fins 104 for more efficiency. The side holes, which are drilled just above the base portion 106, can be drilled thru all the fins 104 or only a selected few as desired. Once again it is recommended that the heat sink's surface maintains the same area or more if possible.

Thirteenth Embodiment of the Present Invention

Figure 23:
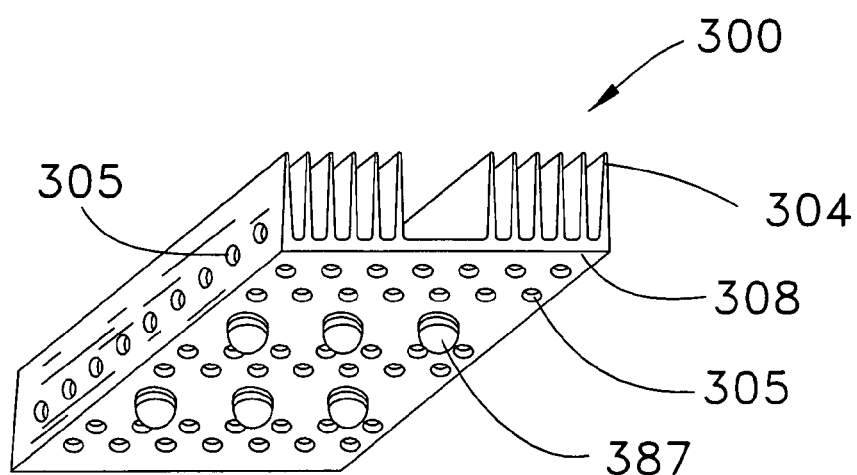
FIG. 23 illustrates a perspective view of a Thirteenth Embodiment horizontally positioned heat sink with power LEDs of the present invention.

FIG. 23 illustrates a Thirteenth Embodiment of the present invention. It is a perspective view of a horizontally positioned heat sink 300 with fins 304 as used in the present invention. This is a variant of the heat sink of FIG. 23 with LED devices 387 mounted on flat surface 308. This is a useful device for non-room lighting such as embedded lighting for industrial applications and machine interior inspection or machine operating etc.

Fourteenth Embodiment of the Present Invention

Figure 24:
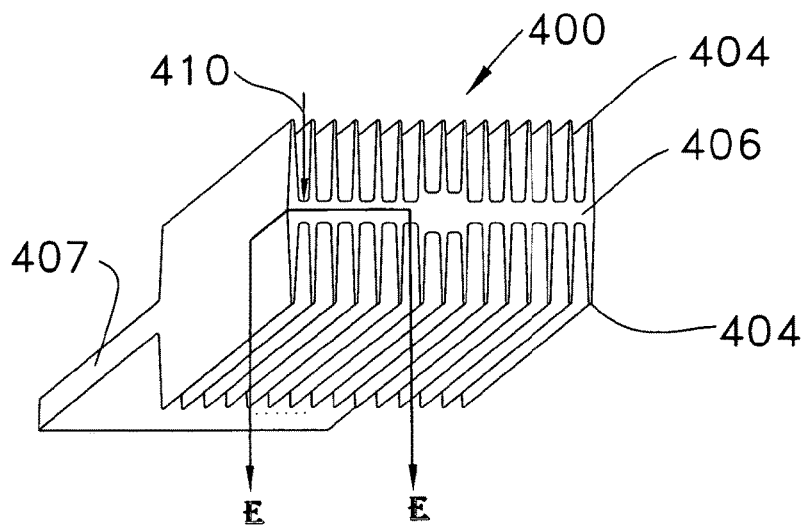
FIG. 24 illustrates a perspective view of a Fourteenth Embodiment fourth horizontally positioned heat sink of the present invention with section E-E indicated.

FIG. 24 illustrates a Fourteenth Embodiment of the present invention. It is a perspective view of a horizontally positioned double sided heat sink 400 with fins 404 positioned on each side of base 406. A flat base portion 407 is used to mount either power LEDs or power semiconductors (not shown) as used in the present invention. This is a heat sink for specialty applications. In cases where side drilling is not desired and partial drilling of one sided finned heatsinks is also not wanted, an alternate is now offered. Thru-drilling in the interstitial gaps between the heat sink fins can be done to achieve good results. The next figure will show section E-E removed.

Figure 25:
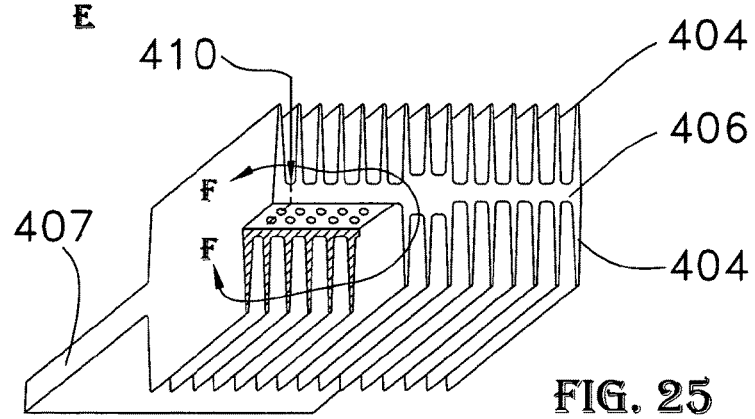
FIG. 25 illustrates a perspective view of a Fourteenth Embodiment horizontally positioned heat sink of the present invention with section E-E shown in FIG. 24 removed and arrows F-F indicating further view magnification in FIG. 25A.
Figure 25A:
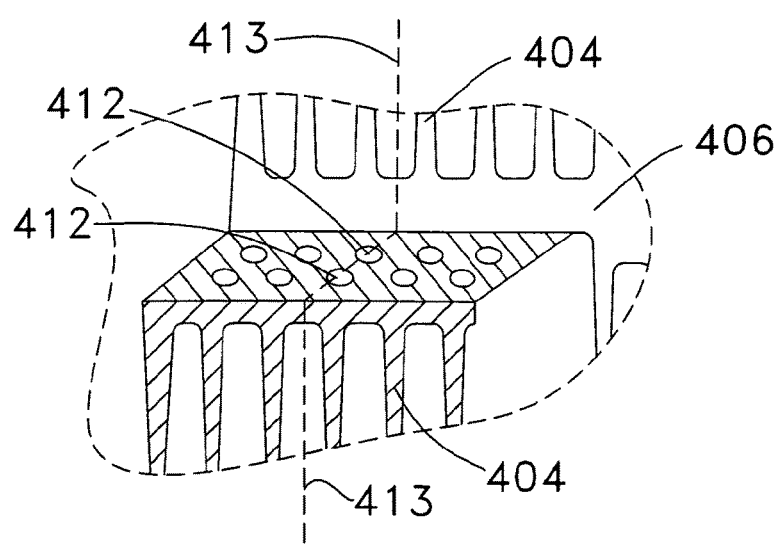
FIG. 25A illustrates a magnified sectional view F-F of FIG. 25.
Figure 26:
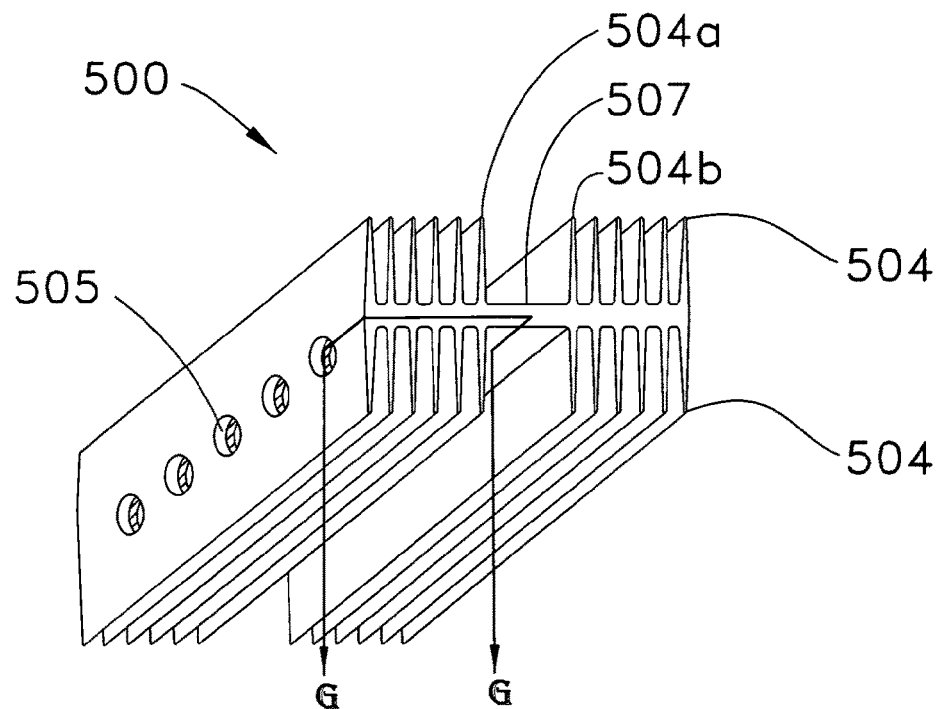
FIG. 26 illustrates a perspective view of a Fifteenth Embodiment horizontally positioned heat sink of the present invention showing arrows G-G.

FIG. 25 illustrates view E-E of FIG. 26 showing holes 410 aligned with interstitial gaps between the heat sink fins 404. As shown by arrow 410 (and dashed line at point of arrow 410 showing hole alignment), FIG. 25A is a magnified view F-F of FIG. 25 showing the holes 412 thru base 406. Note dashed line 413 indicating alignment of holes 412 with the said interstitial spaces between the said heatsink fins 404.

Fifteenth Embodiment of the Present Invention

FIG. 26 illustrates a Fifteenth Embodiment of the present invention. It is a perspective view of a horizontally positioned double sided heat sink 500 with fins 504 positioned on each side of base portion 506. A flat portion 507 both top and bottom is used to mount either power LEDs or power semiconductors (not shown) as used in the present invention. This is a heat sink for higher power dissipation capability. Holes 505 are shown. These said holes are drilled large enough to expose the bases of fins 504, and deep enough to expose the fins save the last fins 504a and 504b for cosmetic purposes and not to interfere with the flat portions 507. The next figure will show section G-G removed.

Figure 27:
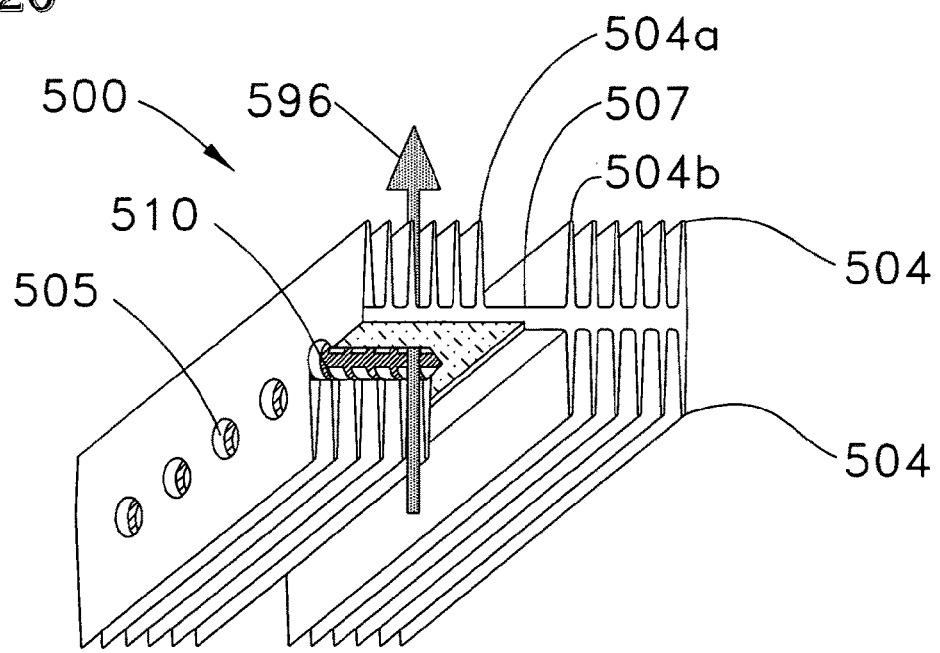
FIG. 27 illustrates a perspective view of a Fifteenth Embodiment horizontally positioned heat sink of the present invention with section G-G removed.

FIG. 27 illustrates the heat sink of FIG. 26 with section G-G removed. Note the exposed fins 510 caused by the drilled holes as described in FIG. 26. During operation, this heatsink now has air moving in a short path straight thru the double fins 504 since the base 506 portions have been drilled out. Air flow as represented by arrow 596 shows this clearly. Once again it is recommended that the heat sink's surface maintains the same area or more if possible.

Sixteenth Embodiment of the Present Invention

Figure 28:
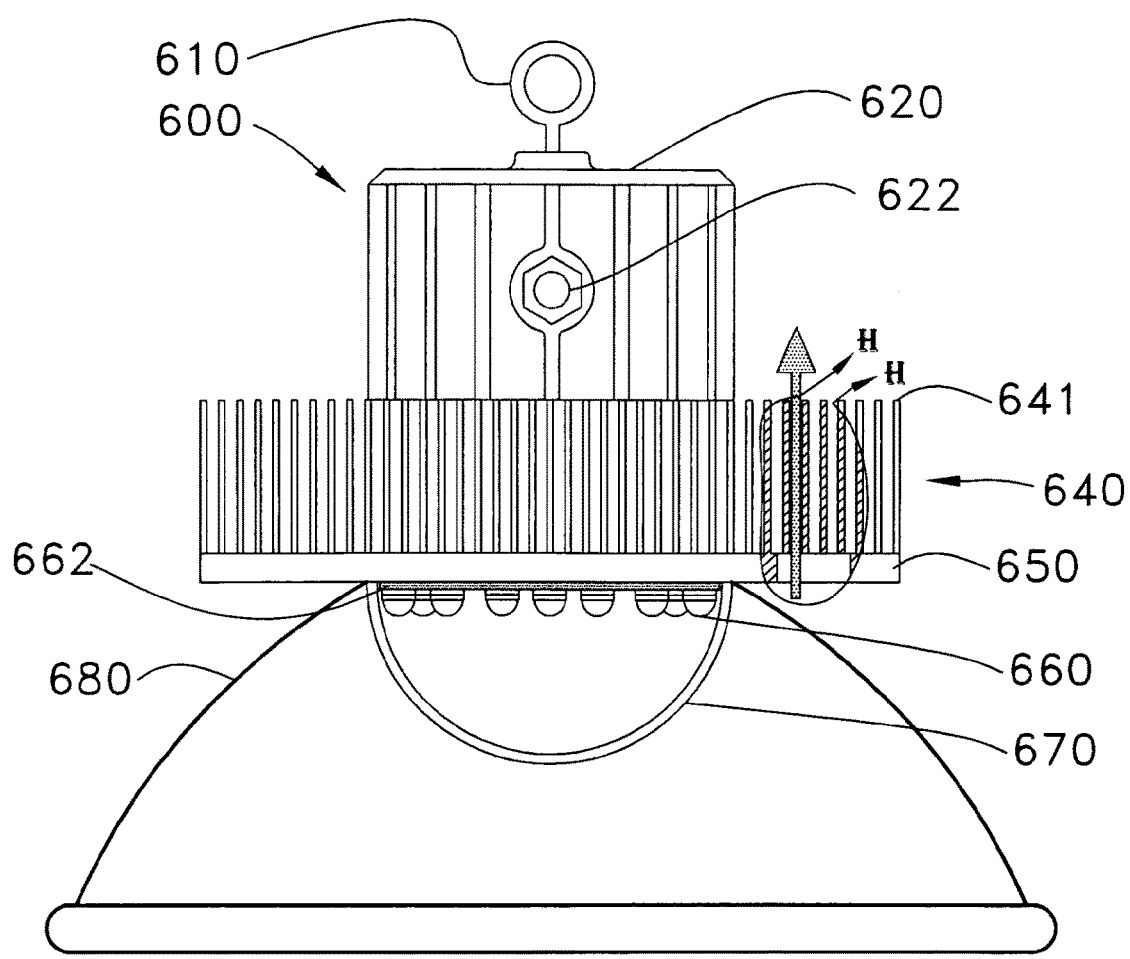
FIG. 28 shows an assembled perspective view of an Sixteenth Embodiment LED lighting device.

FIG. 28 illustrates side view of a Sixteenth Embodiment LED light fixture 600 of the present invention. This is a high power luminaire as would be used in tall warehouses, lamp posts, stadiums, school gymnasiums, etc. These exclusively use high power LEDs and generally come in 200 watt to 500 watt units and up units.

The illustration in FIG. 28 shows a generally circular luminaire but is not limited to this style. A perimetrical structure such as is used in some modern street lights and commercial wall lights etc. is also possible.

Cooling is a massive task; as is water proofing and internal prevention of moisture build up. The said luminaire consists of a large one piece heatsink 640 with fins 641 and a flat base 650. Mounted on the bottom of base 650 is a highly heat conductive (such as copper) heat spreader 662 of special design. A plurality of high power LEDs 660 is mounted on said heat spreader 662. A transparent/translucent cover 670 is provided and an optional large reflector 680 is shown.

Although the said fins 641 are shown to be on the top only, some extra fins could also be placed on selected areas on the bottom (not shown) side also and are hereby incorporated by reference.

To give the reader an idea of size, the heat sink 650 can be as large as a foot (305 mm) or more in diameter. Sitting above heat sink 640 is a central hub section containing a power supply and other optional devices such as, for example ambient light sensors, wired or wireless communication devices etc., with attached "eye Bolt" 610 for mounting purposes. Side bolts 622 are also provided for alternate mounting methods as well.

Figure 29:
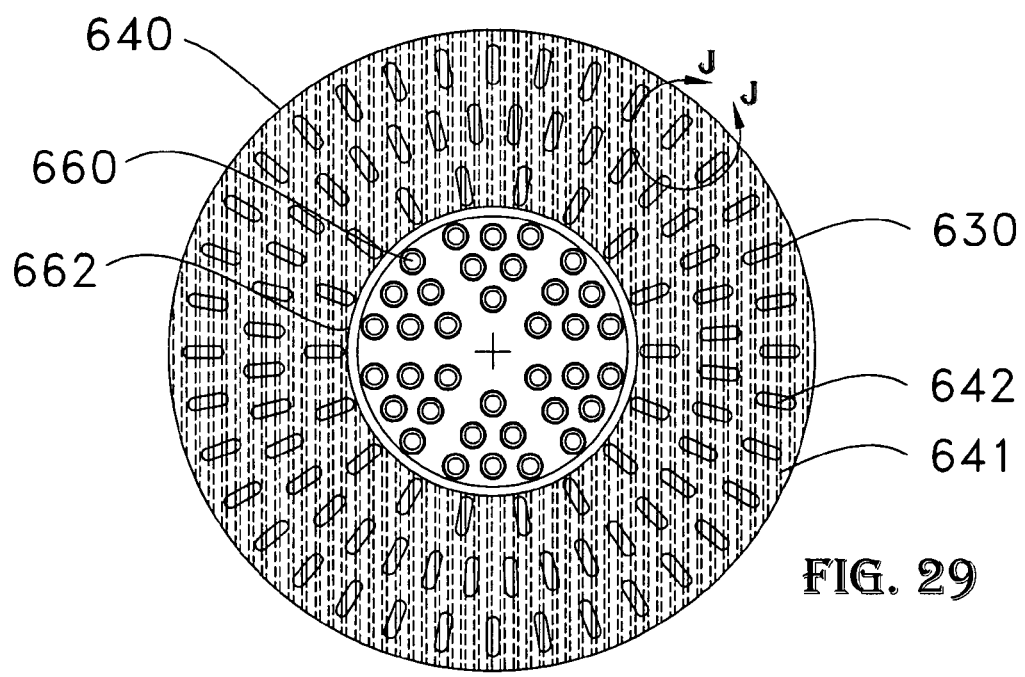
FIG. 29 shows a partial view of an Seventeenth Embodiment LED lighting device.

FIG. 29 illustrates a front face view of heat sink 640 with LED assembly. Slots 630 are milled thru base 650 shown in FIG. 28 exposing the bottom parts of heatsink 640 fins 642. Note circular section H-H.

Figure 30:
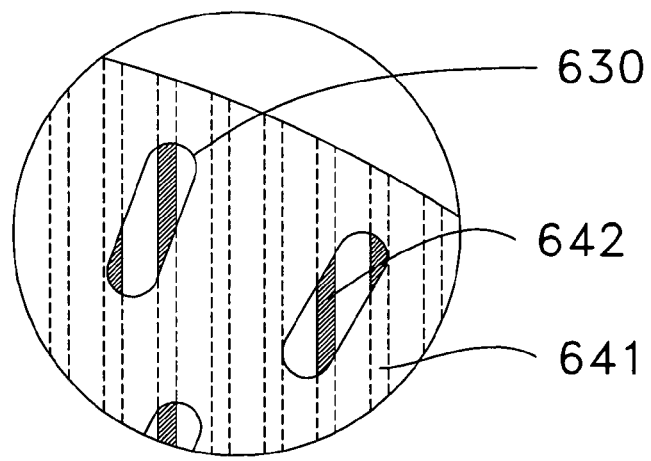
FIG. 30 shows a partial magnified view of an Seventeenth Embodiment LED lighting device.

FIG. 30 illustrates a magnified view section H-H of FIG. 29. Slots 630 are visible and exposed fin sections 642 are clearly shown. Why is this heatsink efficient? The thick base 650 (FIG. 28) conducts the intense heat flux radially outward very fast and the fins 641 sections dissipate the said heat efficiently due to the cooling air moving thru the slots and directly around the fins and subsequently up into the ambient environment. The cooling air first strikes the hottest part of the heatsink fins and then follows a short path up and out, dragging new cooling air up with it. If even higher power LED lighting is desired, the base portion 650 can be made of copper which has twice the thermal conductivity of aluminum, while the fins are still aluminum. The idea is to conduct the heat out of the middle portion where the LEDs are located as quickly as possible. Additionally, graphene layer/s could be added within the base portion 650 for even faster heat conduction and is hereby incorporated by reference.

Seventeenth Embodiment of the Present Invention

Figure 31:
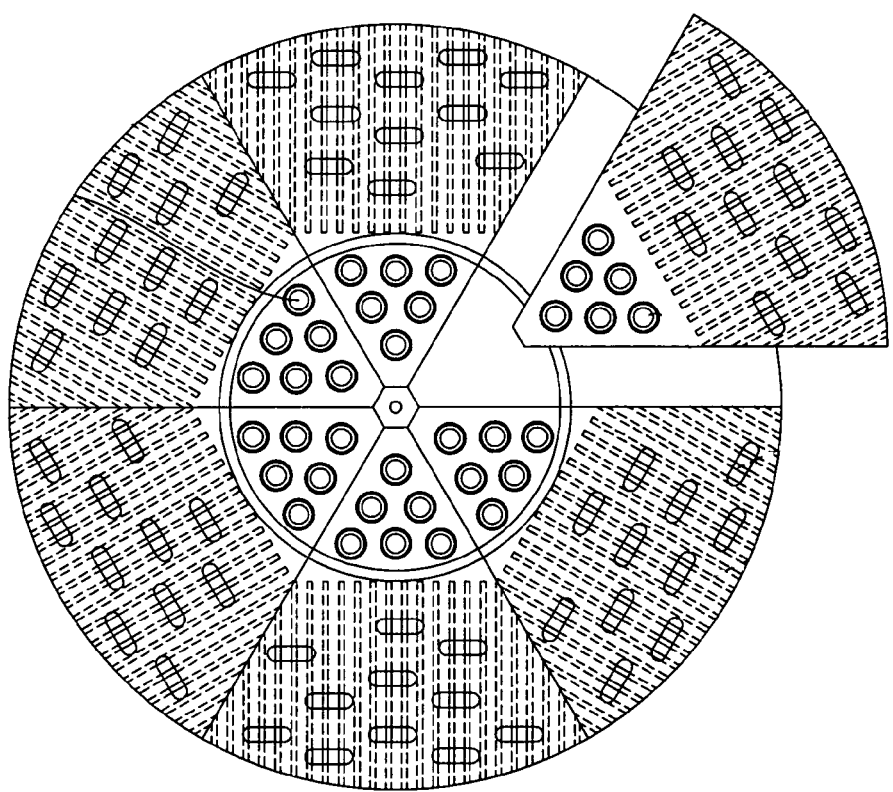
FIG. 31 shows a partially exploded view of the LED assembly of a Seventeenth Embodiment LED lighting device.

FIG. 31 illustrates a Seventeenth Embodiment of the present invention. It is a front face view only of an alternate heat sink and LED assembly for the luminaire shown in FIG. 28. The heatsink of this embodiment is a six part unit, pie shaped in this illustration, but not limited to said shape, and assembled together as shown. One segment is shown jutting out for clarity of description. This method of constructing the luminaire heat sink/LED assembly is advantageous for two reasons. First we are working with a smaller assembly and second, field replacement of sections of the LED/heatsink assemblies is easier than working on the whole massive unit. Indeed making each section pluggable would make field repair easy. Additionally, each said section could have its own smaller power supply which is cheap and adds further redundancy to power supply reliability. If one fails, the other five segments would still provide light. There are a variety ways to practice this invention and are hereby incorporated by reference.

Led Lighting Devices—Short Description

LED lighting is fast becoming as ubiquitous as the incandescent bulb was in the last century. Worldwide, manufacturers and lighting contractors are trampling over each other to get a piece of the action in this business. Generally, LEDs for lighting purposes come in three classes and two types within those classes.

Class 1—Low power LEDs—less than 1 Watt dissipation.
Class 2—High power LEDs—greater than 1 Watt dissipation.
Class 3—Very High power multi-chip LED assemblies—greater than 10 Watts dissipation and supremely difficult to cool.

The two types in class 1 and class 2 are:
1. Wide angle luminance, about 100-165 degrees in a scattered fashion due to a flat LED emitting face.
2. Narrow angle luminance, about 20-60 degrees typically in a Lambertian distribution due to a molded-in lens.

Class 3 devices can be narrow angle up to about 5 watts while higher power units use a plurality of individual chips mounted as an array in one package with a common phosphor applied over the entire said LED chip array and so a narrow angle is more difficult. Indeed, multi-chip units are being made with up to 100 watts dissipation and more. They are supremely difficult to cool with ambient air since the small area heat flux from the multi-chip modules is extremely high. Even solid copper heat transfer is tenuous at best. Forced air cooling is greeted with contempt by customers due to the noise, low reliability and dust accumulation of fans. Dust is impinged upon heat sink fins due to the orders of magnitude greater air flow passing over the said heat sink fins as compared to normal non-forced air flow.

LEDs used in the present invention are mostly of the low power type because they are individually inexpensive and are thermally manageable. A typical fixture of the present invention can use dozens of low power LED devices, each with less than one watt dissipation. However, the present invention does accommodate high power LED technology since the market demands it.

Figure 32:
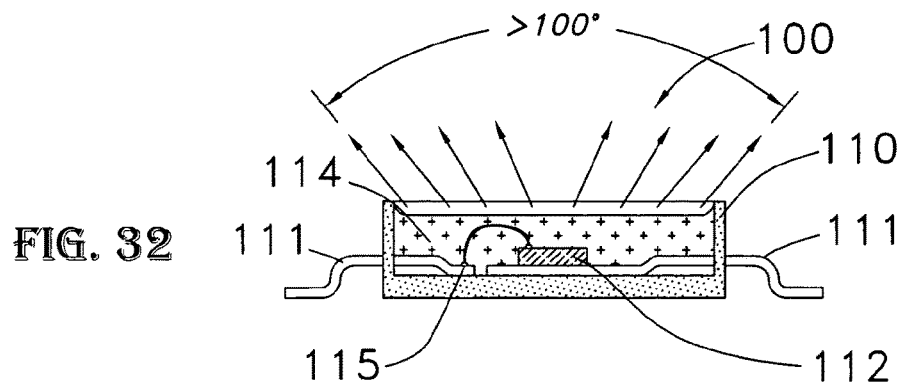
FIG. 32 shows a LED surface mount chip with wide angle light emission.

FIG. 32 illustrates a sectional view of a low power surface mount LED 100 with wide angle characteristics. It consists of a housing 110, a copper lead frame 111, upon which is bonded a light emitting silicon chip 112. A wire bond 115 connects the top section of chip 112 to the other lead 111 (left copper lead in FIG. 22). A rather large phosphor fill 114 is provided which emits white light. The copper leads 111 provide conductive heat transfer to a printed circuit board (not shown) on which the LED 100 is soldered.

Figure 33:
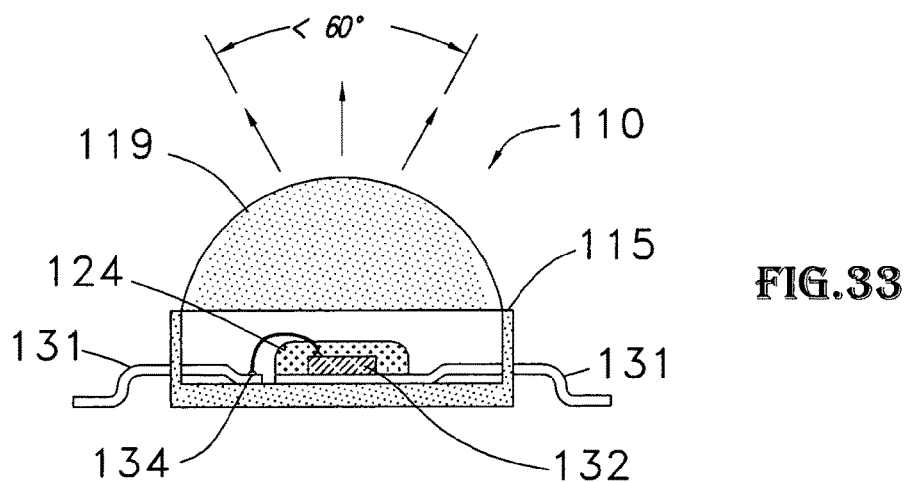
FIG. 33 shows a LED surface mount chip with narrow angle light emission.

FIG. 33 illustrates a sectional view of a low power surface mount LED 120 with narrow angle characteristics. It consists of a housing 115, a copper lead frame 131, upon which is bonded a light emitting silicon chip 132. A wire bond 134 connects the top section of chip 132 to the other lead 131 (left copper lead in FIG. 33). Unlike in the wide angle LED shown in FIG. 32, a relatively compact phosphor covering 124 surrounds the chip which emits white light in an intense almost point source configuration. A molded focusing lens 119 is also provided. The lens 119 in combination with the mentioned small phosphor 124 the light emission angle considerably. The copper leads 131 provide conductive heat transfer to a printed circuit board (not shown) on which the LED 110 is soldered.

Figure 34:
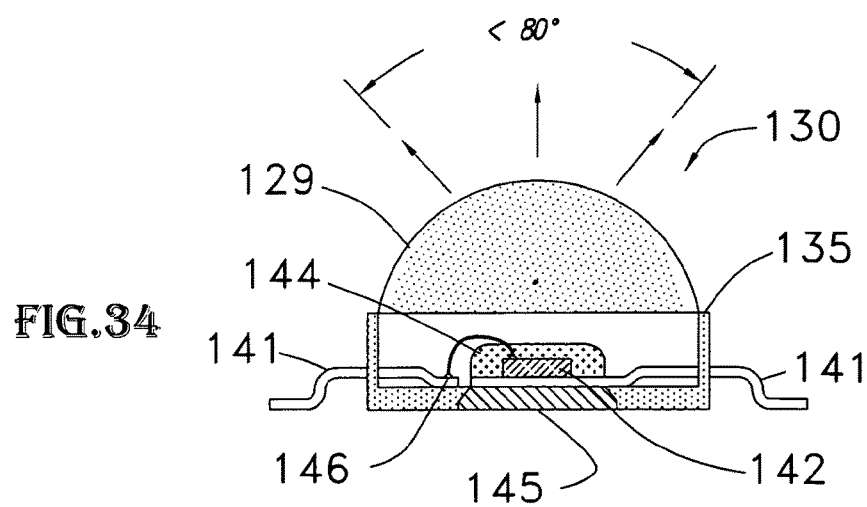
FIG. 34 shows a power LED surface mount chip with narrow angle light emission.

FIG. 34 illustrates a sectional view of a power surface mount LED 130 with narrow angle characteristics. It consists of a housing 135, a copper lead frame 141, upon which is bonded a light emitting silicon chip 142. A wire bond 146 connects the top section of chip 142 to the other lead 141 (left copper lead in FIG. 34). Unlike in the wide angle LED shown in FIG. 32, a relatively compact phosphor covering 134 surrounds the chip which emits white light in an intense almost point source configuration. A molded focusing lens 129 is also provided. The lens 129 in combination with the mentioned small phosphor 144 narrows the light emission angle considerably. The copper leads 141 provide conductive heat transfer to a printed circuit board (not shown) on which the LED 130 is soldered. Additionally, a copper or other highly conductive material slug 145 removes heat from the silicon chip directly to the exposed bottom portion of LED 130 which can be soldered to a PCB as well as the leads 141.

High power LEDs use a great variety of mounting methods from large area solder flow to directly bolting to a big heatsink.

SUMMARY RAMIFICATIONS AND SCOPE

The fixtures described in this teaching provide the installation professional several advantages, some of which are summarized as follows:
1. Low cost.
2. Universal mounting positions.
3. Minimum installation labor.
4. Retrofit versatility.
5. Light weight.
6. Low power consumption.

A hidden feature of LED light fixtures is that these fixtures can be made to produce white, red, green, blue or yellow light. For example a yellow or red light fixture may be used in a chemistry lab or photo processing lab where white light is not desired. Indeed the same fixture could be made to have two or more color LEDs so that one fixture can perform both jobs as necessary. This was not easily done with fluorescent light fixtures of the past. Furthermore RGB LED lights can produce a variety of colors necessary by controlling the power to each of the three led devices. Generally this is done using Pulse Width Modulation techniques which will not be described here since it is well understood in the art. These features can be controlled remotely by Power Line Signal or Optical Signal or Radio Frequency Signal means. They will not be described since they also are well known in the art. These control devices are available on the commercial market as complete modules. Most are covered by their own patent portfolios; thus this disclosure does not claim their technology, but does claim the use of these said control devices in the specific environment of LED devices described herein.

RGB LEDs can also be used for white light variations such a "warm white" for winter and a "cool white" for summer etc. ("Warm white" is a lower color temperature tending towards the yellow whereas a "cool white" is a higher color temperature tending towards the blue.). None of the described embodiments showed built-in ballasts/power supplies. Although they were not described, the present invention does not preclude their use as a built in device but has omitted them for clarity of the teaching This inventor claims these aspects of the novelty and the claims section of this patent reflect this clearly. Although the descriptions above contain a number specificities these should not be construed as limiting the scope of the invention but as merely providing illustrations of some of the presently preferred embodiments of this invention. Thus the scope of the invention should be determined by the appended claims and their legal equivalents rather than by the examples provided.

The claims are not limited to the various aspects of this disclosure, but are to be afforded the full scope consistent with the language of the claims. Structures and functional equivalents of the elements of the various aspects described throughout this disclosure that are known or are later come to be known to those skilled in the art are expressly incorporated herein by reference and are intended to be encompassed by metes and bounds of the claims. Additionally, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or in the case of a method claim, the element is recited using the phrase "step for".

What is claimed is:
1. A lamp assembly, comprising:
    a printed circuit board,
    wherein the printed circuit board comprises at least one transverse airflow opening;
    an array of light emitting diodes mounted transversely on the printed circuit board;
    an extruded heat sink comprising at least one flat surface comprising at least one transverse airflow opening, wherein the opening of the printed circuit board aligns with the opening of the at least one flat surface of the extruded heat sink,
wherein both openings comprise a slot that exposes a base portion of a heat sink fin,
wherein both openings extend through a distal portion of the heat sink fin to form an open ended opening,
wherein the base portion is thicker than an end portion of the heat sink fin,
wherein the flat surface is coupled to a housing of the lamp assembly,
wherein the lamp assembly is fastened to a bayonet base comprising a locating lug;
a transparent or translucent cover, and
wherein the cover comprises a plurality of perforations for airflow.

2. The lamp assembly of claim 1, further comprising:
wherein the opening's population density is based on heat sink material.

3. The lamp assembly of claim 1, further comprising:
wherein the heat sink comprises at least one of an aluminum material and a copper material, and
wherein copper comprises a higher slot population density than aluminum.

4. The lamp assembly of claim 1, further comprising:
wherein the heat sink is divided into a plurality of sections comprising at least one light emitting diode mounted on a single bent portion,
wherein the single bent portion comprises an L-bend, and
wherein a heat sink section comprises an area between 30 to 45 square centimeters per Watt of total power dissipation of the light emitting diode.

5. The lamp assembly of claim 1, further comprising:
wherein the heat sink is divided into a plurality of sections comprising at least one light emitting diode mounted on a double bent portion,
wherein the double bent portion comprises a U-bend, and
wherein a heat sink section comprises an area between 30 to 45 square centimeters per Watt of total power dissipation of the light emitting diode.

6. The lamp assembly of claim 1, further comprising:
wherein a width of the heat sink opening equals a thickness of the heat sink for increasing surface area.

7. The lamp assembly of claim 1, further comprising:
wherein the heat sink fin comprises an opening for airflow, and
wherein a width of the heat sink fin's opening equals a thickness of the heat sink fin for increasing surface area.

8. A lamp assembly, comprising:
a printed circuit board,
wherein the printed circuit board comprises at least one transverse airflow opening;
an array of light emitting diodes mounted transversely on the printed circuit board;
an extruded heat sink comprising at least one flat surface comprising at least one transverse airflow opening,
wherein the at least one transverse airflow opening of the printed circuit board aligns with the at least one transverse airflow opening of the flat surface of the heat sink,
wherein both openings comprise a slot that exposes a base portion of a heat sink fin,
wherein the at least one transverse airflow opening of the flat surface of the heat sink comprises a metal piercing shape, or a stamped shape,
wherein the metal piercing shape comprises a triangular portion extruded on an opposing side of the pierced heat sink fin for increasing surface area, and
wherein the stamped shape comprises a raised bridge-like portion for increasing surface area.

9. The lamp assembly of claim 8, further comprising:
wherein the slot comprises at least one of a rounded end and a square-shaped end, and
wherein the slot comprises at least one of a straight, curved and arced structure.

10. The lamp assembly of claim 8, further comprising:
wherein the slot comprises a sharp edge for permitting turbulent airflow through the slot, and
wherein the turbulent airflow increases convective heat transfer from the lamp assembly to the airflow.

11. The lamp assembly of claim 8, further comprising:
wherein the heat sink comprises fins disposed on opposing sides of a flat base portion.

12. The lamp assembly of claim 8, further comprising:
wherein a plurality of slots are configured in a radial pattern to increase heat conduction of the heat sink.

13. A lamp assembly, comprising:
a printed circuit board,
wherein the printed circuit board comprises at least one transverse airflow opening;
an array of light emitting diodes mounted transversely on the printed circuit board;
an extruded heat sink comprising at least one flat surface comprising at least one transverse airflow opening,
wherein the at least one transverse airflow opening of the printed circuit board aligns with the at least one transverse airflow opening of the flat surface of the heat sink,
wherein both openings comprise a slot that exposes a base portion of a heat sink fin,
wherein at least one opening for airflow is disposed in a flat surface of the base portion of the heat sink fin located in an interstitial gap between a pair of heat sink fins,
wherein the lamp assembly is at least forty-two inches in length, and
a hoop device for supporting the lamp assembly.

14. The lamp assembly of claim 13, further comprising:
wherein the opening is aligned with the interstitial gap.

15. The lamp assembly of claim 13, further comprising:
wherein the hoop device comprises a half hoop with two end-clip hooks, and
wherein the end-clip hooks are fitted into grooves of the housing.

16. The lamp assembly of claim 13, further comprising:
wherein the hoop device comprises full hoops including hook clips disposed internally at 180-degrees apart.

17. The lamp assembly of claim 13, further comprising:
wherein the base portion comprises a light emitting diode mounted thereon.

18. The lamp assembly of claim 13, further comprising:
wherein a light emitting diode is mounted on the flat surface of the heat sink.

* * * * *